(12) United States Patent
Yoshino et al.

(10) Patent No.: US 9,484,710 B2
(45) Date of Patent: Nov. 1, 2016

(54) SEMICONDUCTOR LASER DEVICE

(71) Applicant: USHIO DENKI KABUSHIKI KAISHA, Tokyo (JP)

(72) Inventors: Masaya Yoshino, Hyogo (JP); Toru Kontani, Hyogo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/852,141

(22) Filed: Sep. 11, 2015

(65) Prior Publication Data

US 2015/0380894 A1 Dec. 31, 2015

Related U.S. Application Data

(63) Continuation of application No. PCT/JP2014/056418, filed on Mar. 12, 2014.

(30) Foreign Application Priority Data

Mar. 13, 2013 (JP) .................................. 2013-049772

(51) Int. Cl.
*H04S 5/00* (2006.01)
*H01S 5/00* (2006.01)
(Continued)

(52) U.S. Cl.
CPC ........... *H01S 5/0071* (2013.01); *G02B 6/4206* (2013.01); *G02B 6/4212* (2013.01); *G02B 27/30* (2013.01); *H01S 5/4012* (2013.01); *H01S 5/4056* (2013.01); *G02B 6/4214* (2013.01); *G02B 6/4296* (2013.01);
(Continued)

(58) Field of Classification Search
None
See application file for complete search history.

(56) References Cited

U.S. PATENT DOCUMENTS

| | | | |
|---|---|---|---|
| 5,418,880 A | 5/1995 | Lewis et al. | |
| 2008/0268374 A1* | 10/2008 | Tashiro | G03F 7/0045 430/280.1 |

(Continued)

FOREIGN PATENT DOCUMENTS

| | | |
|---|---|---|
| JP | 2000-251308 A | 9/2000 |
| JP | 2003-103389 A | 4/2003 |
| JP | 2004-179607 A | 6/2004 |
| JP | 2005-300954 A | 10/2005 |
| JP | 2007-286481 A | 11/2007 |
| JP | 2009-204871 A | 9/2009 |
| JP | 2012-118129 A | 6/2012 |

OTHER PUBLICATIONS

International Search Report issued in Application No. PCT/JP2014/056418, mailed Jun. 10, 2014.

*Primary Examiner* — Eileen Adams
(74) *Attorney, Agent, or Firm* — Michael Best & Friedrich LLP

(57) ABSTRACT

A semiconductor laser device includes: semiconductor laser arrays; collimating members; a condenser lens provided, in common, for collimated light beam arrays outputted from the respective collimating members, and including a light incident surface on which a light incident row pattern including light incident regions is formed through entering of the collimated light beam arrays; and an optical fiber. A condenser lens incident optical path length of at least one of the semiconductor laser arrays is different from that of any other one of the semiconductor laser arrays. A collimated light beam array derived from one of the semiconductor laser arrays that corresponds to the largest condenser lens incident optical path length is directed to a predetermined light incident region in the light incident surface. The predetermined light incident region is other than the outermost light incident region in the light incident row pattern.

7 Claims, 10 Drawing Sheets

(51) Int. Cl.
  *H01S 5/40* (2006.01)
  *G02B 27/30* (2006.01)
  *G02B 6/42* (2006.01)
  *H01S 5/022* (2006.01)
(52) U.S. Cl.
  CPC ....... *H01S 5/02236* (2013.01); *H01S 5/02288* (2013.01); *H01S 5/02292* (2013.01); *H01S 5/405* (2013.01); *H01S 5/4025* (2013.01)

(56) References Cited

U.S. PATENT DOCUMENTS

2012/0019909 A1   1/2012  Xiao
2012/0329247 A1* 12/2012  Sakamoto .......... B23K 26/0057
                                                    438/462

* cited by examiner

SEMICONDUCTOR LASER DEVICE

CROSS REFERENCE TO RELATED APPLICATIONS

This is a continuation of International Application No. PCT/JP2014/056418, filed Mar. 12, 2014, which claims the benefit of Japanese Priority Patent Application JP2013-049772, filed Mar. 13, 2013, the entire contents of both of which are incorporated herein by reference.

BACKGROUND

The invention relates to a semiconductor laser device, and more particularly, for example, to a semiconductor laser device including a structure that causes laser light beams derived from semiconductor laser arrays to enter an optical fiber.

Among existing semiconductor laser devices, there are certain types of semiconductor laser devices that include a structure in which a semiconductor laser array, having linearly-disposed light-emitting elements, is employed as a laser light source, and laser light from the semiconductor laser array is guided by and outputted via an optical fiber. For example, reference is made to U.S. Pat. No. 5,617,492.

SUMMARY

It is desirable to provide a semiconductor laser device that makes it possible to cause light beams derived from semiconductor laser arrays to enter an optical fiber with high efficiency. A semiconductor laser device according to an embodiment of the invention includes: a plurality of semiconductor laser arrays each including a plurality of linearly-disposed light emitting elements; collimating members each disposed in an optical path of a light beam array emitted from each of the semiconductor laser arrays; a condenser lens provided, in common, for a plurality of collimated light beam arrays outputted from the respective collimating members, and including a light incident surface on which a light incident row pattern is formed through entering of the collimated light beam arrays, in which the light incident row pattern includes a plurality of light incident regions arranged in a side-by-side arrangement manner; and an optical fiber including a substantially-circular-shaped light incident end surface where light from the condenser lens enters. A condenser lens incident optical path length of at least one of the semiconductor laser arrays is different from a condenser lens incident optical path length of any other one of the semiconductor laser arrays. The condenser lens incident optical path length is defined as a length of an optical path from each of the semiconductor laser arrays to the condenser lens. A collimated light beam array derived from one of the semiconductor laser arrays that corresponds to the largest condenser lens incident optical path length is directed to a predetermined light incident region in the light incident surface of the condenser lens. The predetermined light incident region is other than the outermost light incident region in the light incident row pattern.

In the semiconductor laser device according the above-described embodiment of the invention, it is possible to cause the light beams derived from the semiconductor laser arrays to enter the optical fiber with high efficiency. It is to be understood that both the foregoing general description and the following detailed description are exemplary, and are intended to provide further explanation of the invention as claimed. Also, effects of the invention are not limited to those described above. Effects achieved by the invention may be those that are different from the above-described effects, or may include other effects in addition to those described above.

DETAILED DESCRIPTION

In the following, some example embodiments of the invention are described in detail with reference to the accompanying drawings. Note that the following description is directed to illustrative examples of the invention and not to be construed as limiting to the invention. Also, factors including, without limitation, arrangement, dimensions, and a dimensional ratio of elements illustrated in each drawing are illustrative only and not to be construed as limiting to the invention. Before describing some example embodiments of the invention, a description is given of some comparative examples.

COMPARATIVE EXAMPLES

Figure 8:
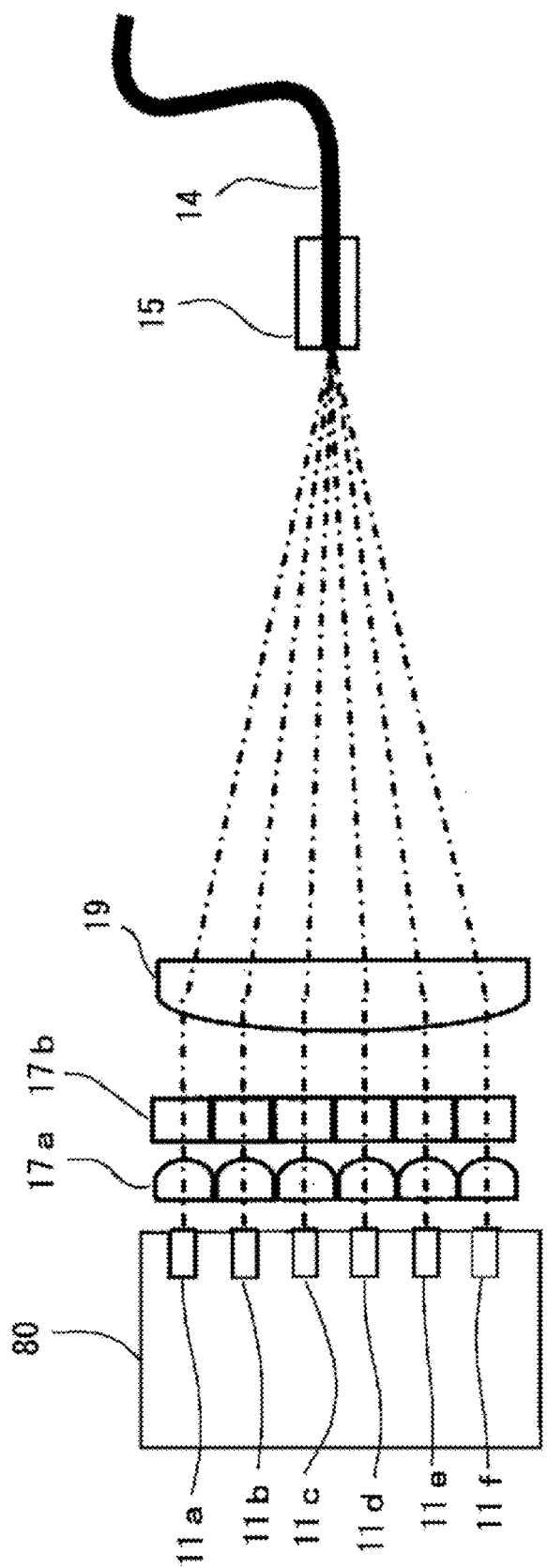
FIG. 8 is a schematic view of a configuration of a semiconductor laser device according to a comparative example of a related art.

FIG. 8 illustrates a semiconductor laser device that includes semiconductor laser arrays 11a, 11b, 11c, 11d, 11e, and 11f according to a comparative example. The semiconductor laser arrays 11a to 11f are provided in a lamination arrangement in which the semiconductor laser arrays 11a to 11f are linearly disposed along a fast-axis direction of the semiconductor laser arrays 11a to 11f.

In the semiconductor laser device, a condenser lens 19 is provided at the downstream side (i.e., the right side of FIG. 8) in a light emission direction of the semiconductor laser arrays 11a to 11f. Collimating members are provided at their respective positions close to the semiconductor laser arrays 11a to 11f between the condenser lens 19 and the semiconductor laser arrays 11a to 11f. Each of the collimating members includes a slow-axis collimator lens array 17a and a fast-axis collimator lens array 17b. A heat sink 80, an optical fiber 14, and an optical fiber holding member 15 are also indicated in FIG. 8.

In semiconductor laser devices such as the above-described semiconductor laser device, spaces between semiconductor laser arrays are narrow and heat dissipation is insufficient. Thus, in the above-described semiconductor laser device, a temperature of each of the semiconductor laser arrays 11a to 11f becomes high. In general, as the temperature of each of the semiconductor laser arrays 11a to 11f becomes high, an output decreases along with reliability. Thus, the above-described semiconductor laser device is disadvantageous in terms of not being able to have sufficient output and reliability.

Figure 9:
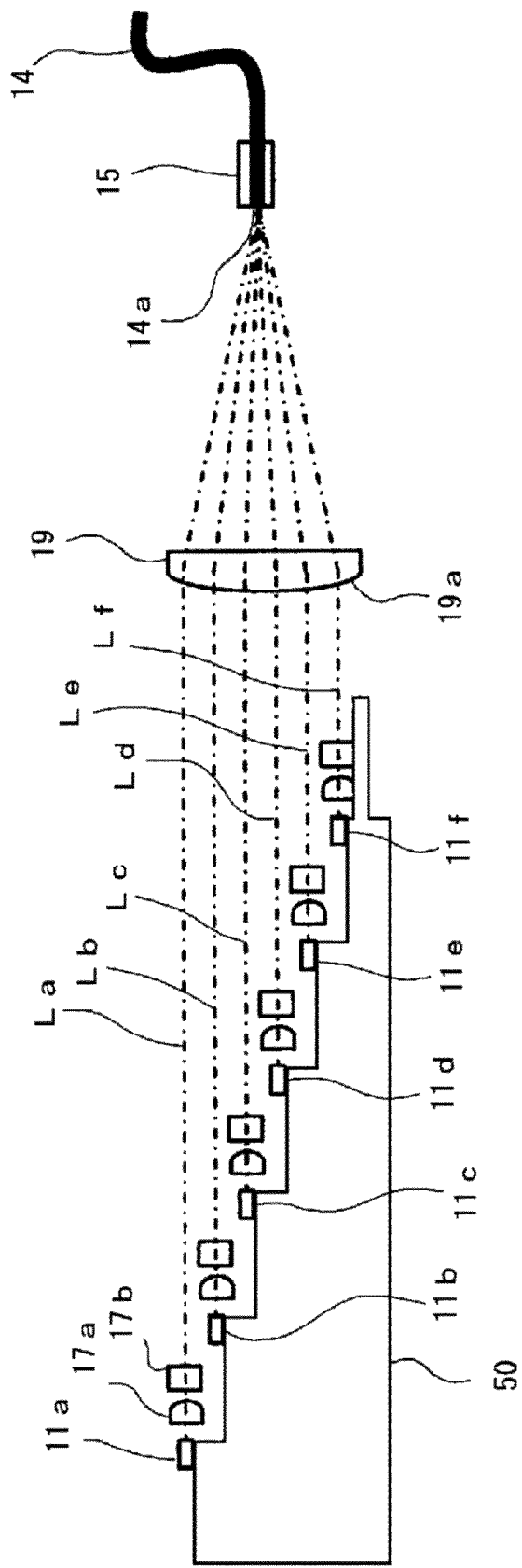
FIG. 9 is a schematic view of a configuration of a semiconductor laser device according to another comparative example of a related art.

FIG. 9 is a schematic view of a configuration of a semiconductor laser device according to another comparative example. Semiconductor laser arrays 11a, 11b, 11c, 11d, 11e, and 11f are provided, on a surface of a heat sink 50, in a lamination arrangement in which the semiconductor laser arrays 11a to 11f are disposed in a step-shaped arrangement along a fast-axis direction.

In the above-described semiconductor laser device illustrated in FIG. 9 according to another comparative example, adjacent semiconductor laser arrays can be widely spaced apart. Thus, in the above-described semiconductor, it is possible to prevent each of the semiconductor laser arrays 11a to 11f from being high in temperature.

However, a disadvantage of not being able to effectively utilize laser light beams from the semiconductor laser arrays 11a to 11f becomes pronounced in the above-described semiconductor laser devices. This disadvantage arises due to employing, as a laser light source, a semiconductor laser array instead of a single emitter semiconductor element having one light-emitting element.

More specifically, with respect to the semiconductor laser arrays 11a to 11f, light-emitting elements are disposed in a linear arrangement. Due to spaces between the light-emitting elements being narrow, typically around several tens of micrometers to around a hundred and several tens of micrometers, obtaining a sufficient parallel state in a slow-axis direction with collimation is difficult. Collimated light beams by collimating members typically have divergencies of several milliradians to several tens of milliradians along the slow-axis direction. Note that in a case of employing the single emitter semiconductor element, a collimated light can be regarded as a substantially parallel light. In the above-described semiconductor laser device, as a distance between a condenser lens 19 and the semiconductor laser arrays 11a to 11f becomes longer, light beam widths (hereinafter may be also referred to as slow-axis direction light beam width) of the laser light beams in the slow-axis direction become larger at an arrangement position of the condenser lens 19. As expressed by the following numerical formula (1), a slow-axis direction light beam width w1 of a laser light beam (i.e., collimated light beam) that enters the condenser lens 19 is a value obtained by adding a product to a slow-axis direction light beam width w0 of the collimated light beam outputted from a collimating member. The product is a product of a divergence angle θ of the collimated light beam multiplied by a propagating distance L of the collimated light beam from the collimating member to the condenser lens 19. In regard to the laser light beams having large slow-axis direction light beam widths, a portion of the laser light beams does not enter the condenser lens 19 or an optical fiber 14, leading to loss and a generation of a so-called vignetting phenomenon. Accordingly, the portion of the laser light beams that is failed to enter the condenser lens 19 or the optical fiber 14 is not outputted from the optical fiber 14. Thus, in the above-described semiconductor laser device, a fiber coupling efficiency is small. The "fiber coupling efficiency" is a value expressing a proportion of laser light beams (i.e., intensity) that enter an optical fiber from among laser light beams of semiconductor laser arrays that form a light source.

$$w1 = w0 + \theta \cdot L \qquad \text{Numerical formula (1):}$$

Figure 10:
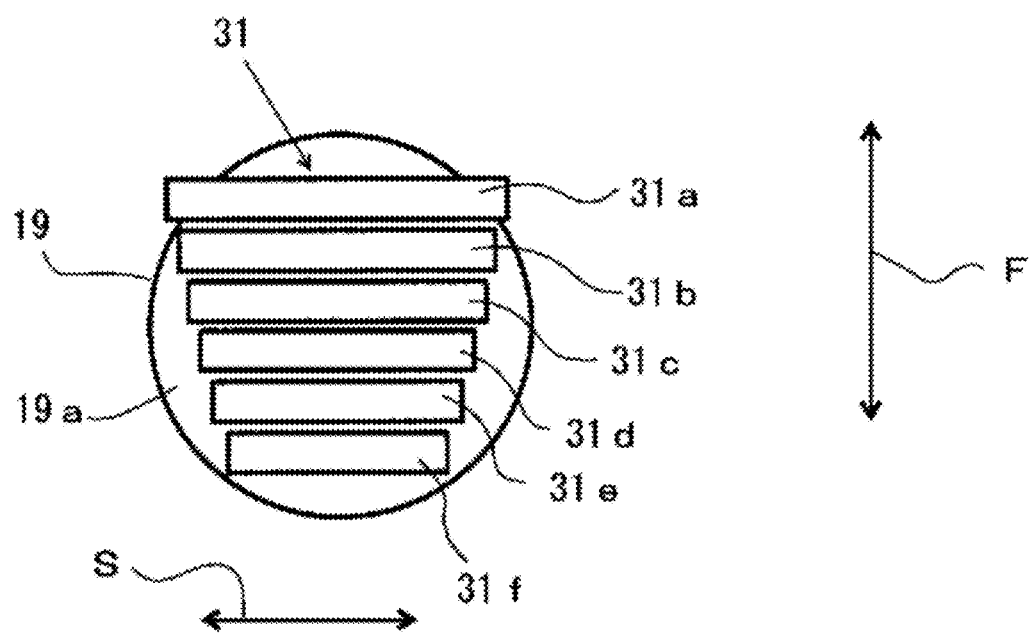
FIG. 10 is a schematic view of a light incident row pattern formed at a light incident surface of a condenser lens in the semiconductor laser device of FIG. 9.

In the above-described semiconductor laser device, the semiconductor laser array 11a has the longest distance with regard to a separating distance to the condenser lens 19. The laser light beams (hereinafter may be also referred to as "longest laser light beams") from the semiconductor laser array 11a have larger slow-axis direction light beam widths at the arrangement position of the condenser lens 19 as compared with the laser light beams from the other semiconductor laser arrays 11b to 11f at the arrangement position of the condenser lens 19. In addition, the longest laser light beams pass through a light incident surface 19a of the condenser lens 19 at a position towards a periphery of the light incident surface 19a. More specifically, as illustrated in FIG. 10 according to another comparative example, the laser light beams of the semiconductor laser arrays 11a to 11f enter the light incident surface 19a in a side-by-side arrangement manner. Among the laser light beams, or "light beam arrays", of the semiconductor laser arrays 11a to 11f, the longest laser light beams enter the light incident surface 19a at the outermost position, that is, the outermost position of a light incident row pattern 31. Note that the "light incident row pattern" 31 is formed as a result of projection, in the side-by-side arrangement manner at the light incident surface 19a, of laser light beams of the semiconductor laser arrays 11a to 11f. The light incident row pattern 31, formed by the laser light beams of the semiconductor laser arrays 11a to 11f, includes light incident regions 31a, 31b, 31c, 31d, 31e, and 31f that have substantially rectangular shapes and that are arranged in the side-by-side arrangement manner. Thus, with regard to a light incident end surface of the optical fiber 14 configured by one end surface 14a having a circular shape, the longest laser light beams that have the largest slow-axis direction light beam widths enter the light incident end surface at a position closest to a periphery of the light incident end surface. Accordingly, the longest laser light beams are prone to loss in which a portion of the longest laser light beams does not enter the optical fiber 14.

FIG. 9 also indicates optical paths La, Lb, Lc, Ld, Le, and Lf. The optical paths La to Lf respectively correspond to paths of the laser light beams from the semiconductor laser arrays 11a to 11f.

Figure 1:
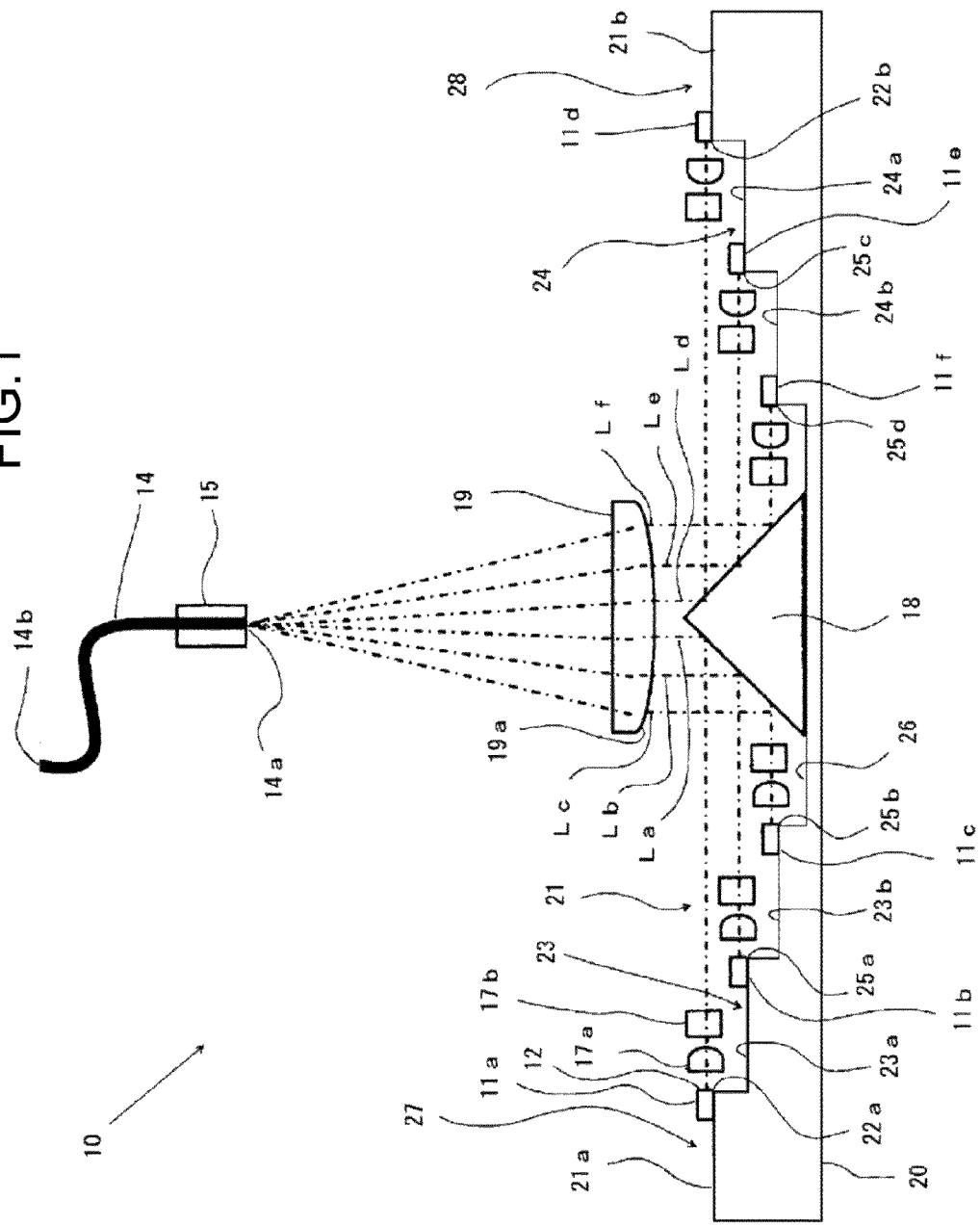
FIG. 1 is a schematic view of an example of a configuration of a semiconductor laser device according to an embodiment of the invention.

In FIG. 10, arrow F indicates the fast-axis direction of the semiconductor laser arrays 11a to 11f and arrow S indicates the slow-axis direction of the semiconductor laser arrays 11a to 11f First Embodiment FIG. 1 is a schematic view of an example of a configuration of a semiconductor laser device according to an embodiment of the invention. The semiconductor laser device 10 includes semiconductor laser arrays 11a, 11b, 11c, 11d, 11e, and 11f that serve as laser light sources. The semiconductor laser arrays 11a to 11f each include linearly-disposed light-emitting elements. Laser light beams, or a "light beam array", derived from each of the semiconductor laser arrays 11a to 11f are outputted to the outside via an optical fiber 14. The semiconductor laser arrays 11a to 11f may be provided on an upper surface (i.e., upper surface in FIG. 1) of a heat sink 20 made of a metal such as, but not limited to, copper and aluminum. The semiconductor laser arrays 11a to 11f may be so disposed that the semiconductor laser arrays 11a to 11c respectively oppose the semiconductor laser arrays 11d to 11f. A sub-mount member (not illustrated in FIG. 1) may be interposed between the heat sink 20 and each of the semiconductor laser arrays 11a to 11f. The sub-mount member may be made of, for example but not limited to, copper-tungsten (CuW) or aluminum nitride (AlN). The semiconductor laser device 10 may further include a folding mirror 18 and a condenser lens 19. The folding mirror 18 may be, for example but not limited to, a triangular prism, and adapted to bend, in the same direction, the laser light beams derived from the semiconductor laser arrays 11a to 11f. The condenser lens 19 condenses the laser light beams bent by the folding mirror 18.

The optical fiber 14 includes one end surface 14a having a substantially circular shape and serving as a light incident end surface, and the other end surface 14b having a substantially circular shape and serving as a light output end surface. The optical fiber 14 is so disposed that the laser light beams condensed by the condenser lens 19 enter the light incident end surface (i.e., one end surface 14a).

In the semiconductor laser device 10 of FIG. 1, the condenser lens 19 has a substantially disc shape. FIG. 1 also indicates optical paths La, Lb, Lc, Ld, Le, and Lf. The optical paths La to Lf respectively correspond to paths of the laser light beams from the semiconductor laser arrays 11a to 11f.

Collimating members may be provided corresponding to the respective semiconductor laser arrays 11a to 11f. The collimating members may be disposed at positions in the optical paths, extending up to the folding mirror 18, of the laser light beams derived from the respective semiconductor laser arrays 11a to 11f. The laser light beams from the semiconductor laser arrays 11a to 11f are collimated by the respective collimating members.

The collimating members may each include a slow-axis collimator lens array 17a and a fast-axis collimator lens array 17b. The slow-axis collimator lens array 17a and the fast-axis collimator lens array 17b each may include lens cells. The lens cells correspond to the respective light-emitting elements in each of the semiconductor laser arrays 11a to 11f. In other words, the slow-axis collimator lens array 17a and the fast-axis collimator lens array 17b include linearly-disposed lens cells.

The collimating members may be disposed at their respective positions close to the semiconductor laser arrays 11a to 11f. By disposing the collimating members at the positions close to the semiconductor laser arrays 11a to 11f, the laser light beams from the semiconductor laser arrays 11a to 11f are allowed to enter the collimating members with high efficiency. Note that the laser light beams (i.e., collimated light beams, or "collimated light beam arrays") collimated by the collimating members have divergencies of several tens of milliradians along a slow-axis direction.

Figure 2:
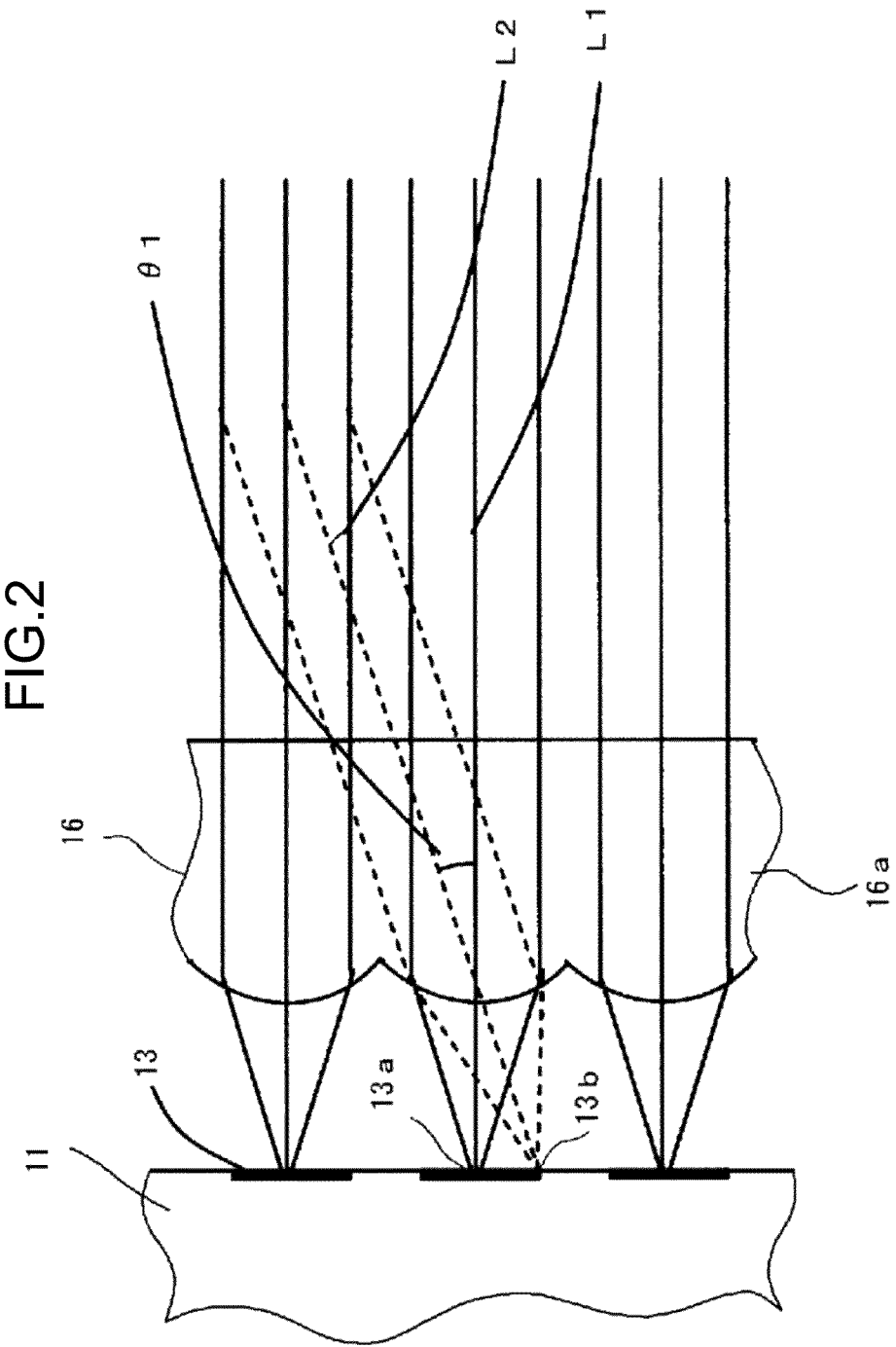
FIG. 2 is a schematic projection view, as seen from a direction perpendicular to an arrangement direction of light-emitting elements, of a state of emission of laser light beams from the light-emitting elements of a semiconductor laser array toward a collimating member, in a case in which the collimating member is disposed at a position close to the semiconductor laser array in the semiconductor laser device according to an embodiment of the invention.
Figure 3:
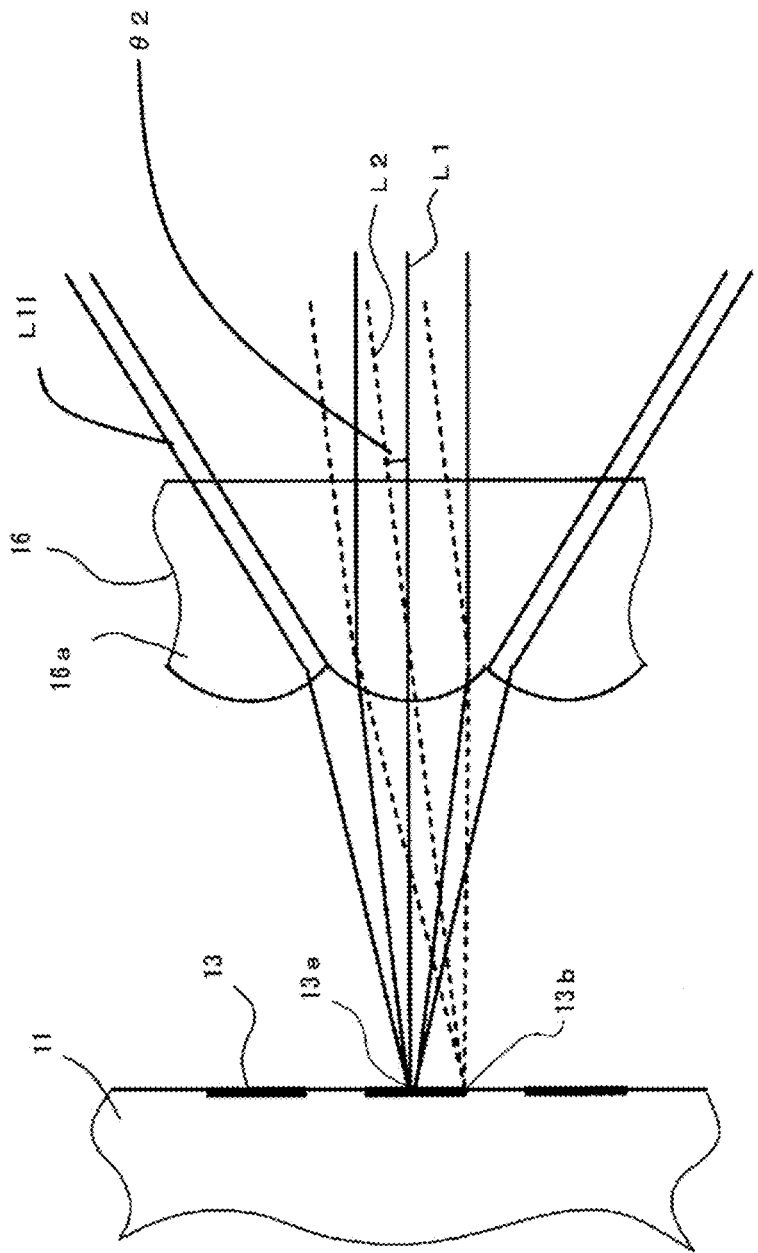
FIG. 3 is a schematic projection view, as seen from the direction perpendicular to the arrangement direction of the light-emitting elements, of the state of emission of the laser light beams from the light-emitting elements of the semiconductor laser array toward the collimating member, in a case in which the collimating member is disposed at a position largely distanced from the semiconductor laser array in the semiconductor laser device according to an embodiment of the invention.

The following is a detailed description, with reference to FIG. 2 and FIG. 3, of one reason as to why the laser light beams from the semiconductor laser arrays 11a to 11f are allowed to enter the collimating members with high efficiency by disposing the collimating members at the position close to the semiconductor laser arrays 11a to 11f, and one reason as to why the collimated light beams collimated by the collimating members have divergencies along the slow-axis direction. FIG. 2 and FIG. 3 are schematic projection views of states of emission of laser light beams from light-emitting elements 13 of a semiconductor laser array 11 toward a collimating member as seen from a direction perpendicular to an arrangement direction of the light-emitting elements 13. More specifically, FIG. 2 illustrates a case in which the collimating member is disposed at a position close to the semiconductor array 11, and FIG. 3 illustrates a case in which the collimating member is disposed at a position largely distanced from the semiconductor array 11.

It is to be noted that in a case in which a single emitter semiconductor element is employed as a laser light source, collimated light by a collimating member (i.e., a collimator lens) is substantially parallel light, due to the number of light-emitting element provided in such single emitter semiconductor element is one.

In the semiconductor array 11, spaces between the light-emitting elements 13 are typically around several tens of micrometers to around a hundred and several tens of micrometers (more specifically, the spaces between the light-emitting elements 13 are approximately 0.5 mm or less). Accordingly, with regard to the collimating member, that is, a collimator lens array 16 configured by lens cells 16a, a size (i.e., a length in a direction of arrangement of the light-emitting elements 13 of the semiconductor array 11) of each of the lens cells 16a structuring the collimator lens array 16 is restricted. Thus, obtaining a sufficient parallel state in a slow-axis direction is difficult with collimation by the collimator lens array 16. Collimated light beams typically have divergencies of several milliradians to several tens of milliradians along the slow-axis direction. In addition, from a standpoint of efficiency of causing the laser light beams to enter the collimator lens array 16, a separating distance between the semiconductor laser array 11 and the collimator lens array 16 is restricted due to factors of the size of each of the lens cells 16a being restricted and the divergencies of the collimated light beams.

In the case in which the collimator lens array 16 is disposed at the position close to the semiconductor array 11 as illustrated in FIG. 2, values of focal lengths of the lens cells 16a approach widths (i.e., lengths in a direction of arrangement of the light-emitting elements 13) of the light-emitting elements 13. Accordingly, the light-emitting elements 13 can no longer be regarded as point light sources. Further, in the light-emitting elements 13, an angle θ1 (i.e., divergence angle) formed of a laser light L1 emitted from a center portion 13a and a laser light L2 emitted from an end portion 13b becomes several tens of milliradians.

In the case in which the collimator lens array 16 is disposed at a position largely distanced from the semiconductor array 11 as illustrated in FIG. 3, focal lengths of the lens cells 16a become longer as compared with the case of disposing the collimator lens array 16 at the position close to the semiconductor array 11. Accordingly, an angle θ2 (i.e., divergence angle) formed of the laser light L1 emitted from the center portion 13a and the laser light L2 emitted from the end portion 13b becomes smaller as compared with the angle θ1 in the case of disposing the collimator lens array 16 at the position close to the semiconductor array 11. However, with regard to the laser light beams from one of the light-emitting elements 13, portions L11 of the laser light beams protrude beyond a light incident surface of the corresponding lens cell 16a. Thus, the portions L11 fail to enter the corresponding lens cell 16a and become loss.

In view of the foregoing, disposing the collimator lens array 16 at the position close to the semiconductor array 11 allows the laser light beams from the semiconductor array 11 to enter the collimator lens array 16 with high efficiency. On the other hand, the collimated light beams from the collimator lens array 16 have divergencies of several tens of milliradians along the slow-axis direction.

In FIG. 2 and FIG. 3, the laser light beams from the center portion 13a of the light-emitting element 13 are illustrated as solid lines, and the laser light beams from the end portion 13b of the light-emitting element 13 are illustrated as broken lines.

In the semiconductor laser device 10, each of the semiconductor laser arrays 11a to 11f may have a rectangular flat plate shape. With regard to each of the semiconductor laser arrays 11a to 11f, a surface 12 that includes the linearly-disposed light-emitting elements 13 serves as a light emission surface. The light-emitting elements 13 in the light emission surface (i.e., the surface 12) are arrayed at specific intervals (for example, at equal intervals of approximately 0.5 mm or less) in a longitudinal direction (a perpendicular direction with respect to a paper surface of FIG. 1). It is preferable that lengths of the semiconductor laser arrays 11a to 11f in the direction of arrangement of the light-emitting elements 13 be the same as each other. In the semiconductor laser device 10 of FIG. 1, specifications of the semiconductor laser arrays 11a to 11f may be the same.

Each of the semiconductor laser arrays 11a to 11f may be an array semiconductor laser element, or may be configured by a plurality of single emitter semiconductor elements disposed in a linear arrangement with intervals of approximately 0.5 mm or less.

The heat sink 20 may have a rectangular parallelepiped shape with a groove 21 at an upper surface. The groove 21 may linearly extend in the shorter direction (a perpendicular direction with respect to a paper surface of FIG. 1) of the upper surface of the heat sink 20. A cross-sectional shape of the groove 21 may be substantially a trapezoid. In the groove 21, mutually-opposing side surfaces 23 and 24 may be slanted in a step-like shape in directions of approaching closer to each other as going toward a bottom surface 26. More specifically, a periphery surface 21a provided at one side of the groove 21 provided on the upper surface of the heat sink 20 and the side surface 23 of the groove 21, which is continuous to the periphery surface 21a, form a step-shaped mounting surface 27 (hereinafter may be also referred to as "first step-shaped mounting surface") for providing the semiconductor laser arrays 11a to 11c. Also, a periphery surface 21b provided at the other side of the groove 21 provided on the upper surface of the heat sink 20 and the side surface 24 of the groove 21, which is continuous to the periphery surface 21b, form a step-shaped mounting surface 28 (hereinafter may be also referred to as "second step-shaped mounting surface") for providing the semiconductor laser arrays 11d to 11f.

In the semiconductor laser device 10 of FIG. 1, the side surface 23 having the step-like shape may include two step surfaces 23a and 23b. The two step surfaces 23a and 23b may have a rectangular shape, and may be parallel to the periphery surface 21a and the bottom surface 26. The side surface 24 may have the same configuration as the side surface 23. More specifically, the side surface 24 having the step-like shape may include two step surfaces 24a and 24b. The two step surfaces 24a and 24b may have a rectangular shape, and may be parallel to the periphery surface 21b and the bottom surface 26. The first step-shaped mounting surface 27 and the second step-shaped mounting surface 28 may oppose each other, and may be symmetrically mirror each other with respect to an optical axis of the condenser lens 19.

In each of the first step-shaped mounting surface 27 and the second step-shaped mounting surface 28, a height of one step may be determined appropriately from the standpoint of laser light usability, that is, may be determined according to light beam widths in a fast-axis direction of the laser light beams from the semiconductor laser arrays 11a to 11f or according to light beam widths in a fast-axis direction of the laser light beams (i.e., collimated light beams) collimated by the collimating members. Note that the height of one step in the first step-shaped mounting surface 27 and one step in the second step-shaped mounting surface 28 may be as follows. In the first step-shaped mounting surface 27, the height of one step may be a difference in position level between the periphery surface 21a and the step surface 23a, as well as a difference in position level between the step surface 23a and the step surface 23b. In the second step-shaped mounting surface 28, the height of one step may be a difference in position level between the periphery surface 21b and the step surface 24a, as well as a difference in position level between the step surface 24a and the step surface 24b.

From the standpoint of heat dissipation, it is preferable that the periphery surface 21a, the periphery surface 21b, the step surface 23a, the step surface 23b, the step surface 24a, and the step surface 24b have their respective sizes that allow entire regions of bottom surfaces (bottom surfaces in FIG. 1) of the semiconductor laser arrays 11a to 11f to come into contact with the periphery surface 21a, the periphery surface 21b, the step surface 23a, the step surface 23b, the step surface 24a, and the step surface 24b.

In the heat sink 20, the periphery surface 21a, the periphery surface 21b, the step surface 23a, the step surface 23b, the step surface 24a, and the step surface 24b may serve as element mounting surfaces. Each of the element mounting surfaces may be provided with a single semiconductor laser array. More specifically, the element mounting surfaces of the first step-shaped mounting surface 27 may be provided with the respective semiconductor laser arrays 11a to 11c. Accordingly, the semiconductor laser arrays 11a to 11c may be provided in a lamination arrangement in which the semiconductor laser arrays 11a to 11c are disposed in a step-shaped arrangement along the fast-axis direction. The element mounting surfaces of the second step-shaped mounting surface 28 may be provided with the respective semiconductor laser arrays 11d to 11f. Accordingly, the semiconductor laser arrays 11d to 11f may be provided in a lamination arrangement in which the semiconductor laser arrays 11d to 11f are disposed in a step-shaped arrangement along the fast-axis direction.

The light emission surfaces (i.e., the surfaces 12) of the respective semiconductor laser arrays 11a to 11c and the light emission surfaces (i.e., the surfaces 12) of the respective semiconductor laser arrays 11d to 11f may be so provided as to oppose each other.

The folding mirror 18 may be provided at the bottom surface 26. The folding mirror 18 may be disposed at a position in which the laser light beams (i.e., collimated light beams) from the semiconductor laser arrays 11a to 11f are incident on the folding mirror 18 and in which the laser light beams that are bent at right angles by the folding mirror 18 enter the condenser lens 19.

In the semiconductor laser device 10 of FIG. 1, the light emission surfaces (i.e., the surfaces 12) of the respective semiconductor laser arrays 11a to 11f may be disposed at respective positions on an edge 22a of the periphery surface 21a, an edge 25a of the step surface 23a, an edge 25b of the step surface 23b, an edge 22b of the periphery surface 21b, an edge 25c of the step surface 24a, and an edge 25d of the step surface 24b. The collimating members of the semiconductor laser arrays 11a to 11f may have the following arrangement. With respect to one of the periphery surfaces having the semiconductor laser array or one of the step surfaces having the semiconductor laser array, the corresponding collimating member may be disposed above the step surface that is one step lower, or above the bottom surface 26.

The folding mirror 18 may be disposed at a center portion of the groove 21. The condenser lens 19 may be disposed at a region near the folding mirror 18 in a light emission direction (i.e., the upper direction of FIG. 1) of the folding mirror 18. The light incident end surface (i.e., one end surface 14a) of the optical fiber 14 may be located at a focal position of the condenser lens 19.

Lengths (hereinafter may be also referred to as "condenser lens incident optical path lengths") of the optical paths of the laser light beams from the semiconductor laser arrays 11a to 11f up to the condenser lens 19 are controlled by disposing the semiconductor laser arrays 11a to 11f at the element mounting surfaces of the first step-shaped mounting surface 27 and the second step-shaped mounting surface 28. More specifically, the condenser lens incident optical path lengths of the laser light beams from the semiconductor laser arrays 11a to 11c are made different from each other relatively due to disposing the semiconductor laser arrays 11a to 11c at the respective element mounting surfaces of the first step-shaped mounting surface 27. Further, the condenser lens incident optical path lengths of the laser light beams from the semiconductor laser arrays 11d to 11f are made different from each other relatively due to disposing the semiconductor laser arrays 11d to 11f at the respective element mounting surfaces of the second step-shaped mounting surface 28.

The condenser lens incident optical path lengths of the laser light beams of the respective semiconductor laser arrays 11a to 11c involve lengths in order of, from long to short, the laser light beams of the semiconductor laser arrays 11a, the laser light beams of the semiconductor laser arrays 11b, and the laser light beams of the semiconductor laser arrays 11c. The condenser lens incident optical path lengths of the laser light beams of the respective semiconductor laser arrays 11d to 11f involve lengths in order of, from long to short, the laser light beams of the semiconductor laser arrays 11d, the laser light beams of the semiconductor laser arrays 11e, and the laser light beams of the semiconductor laser arrays 11f.

In the semiconductor laser device 10 of FIG. 1, the condenser lens incident optical path lengths of the semiconductor laser arrays that are disposed to oppose each other are the same as each other. More specifically, the condenser lens incident optical path length of the semiconductor laser array 11a and the condenser lens incident optical path length of the semiconductor laser array 11d are the same. The condenser lens incident optical path length of the semiconductor laser array 11b and the condenser lens incident optical path length of the semiconductor laser array 11e are the same. The condenser lens incident optical path length of the semiconductor laser array 11c and the condenser lens incident optical path length of the semiconductor laser array 11f are the same.

Figure 4:
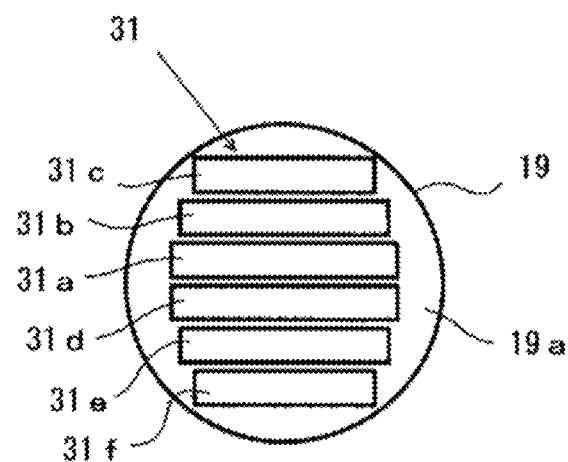
FIG. 4 is a schematic view of a light incident row pattern formed at a light incident surface of a condenser lens in the semiconductor laser device of FIG. 1.

Also, by disposing the folding mirror 18 between the first step-shaped mounting surface 27 and the second step-shaped mounting surface 28, incident positions of the laser light beams from the semiconductor laser arrays 11a to 11f with respect to a light incident surface 19a of the condenser lens 19 are controlled. The laser light beams from the semiconductor laser arrays 11a to 11f enter the light incident surface 19a of the condenser lens 19 in a side-by-side arrangement manner. As illustrated in FIG. 4, the laser light beams, i.e., the light beam array, of the semiconductor laser array 11a and the laser light beams, i.e., the light beam array, of the semiconductor laser array 11d which correspond the largest condenser lens incident optical path lengths enter the light incident surface 19a at positions other than the outermost positions of a light incident row pattern 31 formed on the light incident surface 19a.

Note that the light incident row pattern 31 is formed as a result of projection, in a side-by-side arrangement manner at the light incident surface 19a, of the laser light beams, i.e., the light beam arrays, of the semiconductor laser arrays 11a to 11f. The light incident row pattern 31, formed by the laser light beams of the semiconductor laser arrays 11a to 11f, includes light incident regions 31a, 31b, 31c, 31d, 31e, and 31f that have substantially rectangular shapes and that are arrayed in the side-by-side arrangement manner. Dimensions of the light incident regions 31a to 31f in a direction of arrangement of the light incident regions 31a to 31f (vertical direction in FIG. 4; hereinafter may be also referred to as "pattern array direction") are the same as each other. However, dimensions of the light incident regions 31a to 31f in a direction perpendicular to the pattern array direction (horizontal direction in FIG. 4; hereinafter may be also referred to as "light incident region width") are different from each other. The light incident region widths are due to the light beam widths (hereinafter may be also referred to as "slow-axis direction light beam widths") of the laser light beams in the slow-axis direction. The larger the condenser lens incident optical path length becomes, the larger the light incident region width becomes.

The laser light beams from the semiconductor laser arrays 11a to 11c disposed at the first step-shaped mounting surface 27 enter the light incident surface 19a in order, from a center side, the laser light beams of the semiconductor 11a, the laser light beams of the semiconductor 11b, and the laser light beams of the semiconductor 11c in respect to the light incident row pattern 31. More specifically, the laser light beams from the semiconductor laser array 11a that corresponds to the largest condenser lens incident optical path length enter the light incident surface 19a at a position (i.e., near-center position) closest to the center, whereas the laser light beams from the semiconductor laser array 11c that corresponds to the smallest condenser lens incident optical path length enter the light incident surface 19a at a position (i.e., peripheral position) that is the most distant from the center. Further, the laser light beams from the semiconductor laser arrays 11d to 11f disposed at the second step-shaped mounting surface 28 enter the light incident surface 19a in order, from a center side, the laser light beams of the semiconductor 11d, the laser light beams of the semiconductor 11e, and the laser light beams of the semiconductor 11f in respect to the light incident row pattern 31. More specifically, the laser light beams from the semiconductor laser array 11d that corresponds to the largest condenser lens incident optical path length enter the light incident surface 19a at a position (i.e., near-center position) closest to the center, whereas the laser light beams from the semiconductor laser array 11f that corresponds to the smallest condenser lens incident optical path length enter the light incident surface 19a at a position (i.e., peripheral position) that is the most distant from the center.

In the semiconductor laser device 10 of FIG. 1, the incident positions at the light incident surface 19a of the laser light beams from the semiconductor laser arrays that are disposed to oppose each other may be symmetrical with respect to the center of the light incident surface 19a. A center of the light incident row pattern 31 may be located at the center of the light incident surface 19a, and the light incident row pattern 31 may have a shape symmetrical in the pattern array direction and symmetrical in a direction perpendicular to the pattern array direction with respect to the center of the light incident row pattern 31, i.e., the center of the light incident surface 19a. The optical fiber 14 may include a cylindrical core portion and a clad portion provided at a circumferential surface of the core portion. At the light incident end surface (i.e., one end surface 14a), a substantially-circular-shaped effective reception region is formed by the core portion. The optical fiber 14 may be, for example but not limited to, a silica fiber.

In the semiconductor laser device 10 of FIG. 1, a cylindrical optical fiber holding member 15 having an inner diameter that matches with an outer diameter of the optical fiber 14 may be provided at an end portion on the one end surface side of the optical fiber 14.

Therefore, in the semiconductor laser device 10, the laser light beams from the semiconductor laser arrays 11a to 11f are collimated by the collimating members (the slow-axis collimator lens array 17a and the fast-axis collimator lens array 17b). The laser light beams that are collimated by the collimating members are reflected towards the condenser lens 19 by the folding mirror 18. The laser light beams reflected by the folding mirror 18 are condensed by the condenser lens 19 to enter the light incident end surface (i.e., one end surface 14a) of the optical fiber 14. In this manner, the laser light beams from the semiconductor laser arrays 11a to 11f enter the effective reception region in the light incident end surface of the optical fiber 14, and are guided by the optical fiber 14 to be outputted from the light output end surface (i.e., other end surface 14b) of the optical fiber 14 to the outside. The output light may be utilized as source light for a projector device without limitation.

Further, in the semiconductor laser device 10, the semiconductor laser arrays 11a to 11f are provided with respect to the surface (first step-shaped mounting surface 27 and second step-shaped mounting surface 28) of the heat sink 20 in the lamination arrangement in which the semiconductor laser arrays 11a to 11f are disposed in the step-shaped arrangement along the fast-axis direction. Accordingly, adjacent semiconductor laser arrays are largely distanced from each other, making it possible to achieve high heat dissipation. As a result, each of the semiconductor laser arrays 11a to 11f involves high reliability and high output.

Also, the laser light beams from the semiconductor laser arrays 11a to 11f so enter the circular light incident surface 19a of the condenser lens 19, to form the light incident row pattern 31, that the larger the condenser lens incident optical path length of the laser light beams, the closer the incidence position is with respect to the center of the light incident surface 19a. More specifically, the laser light beams are so projected in the side-by-side arrangement manner onto the light incident surface 19a of the condenser lens 19 to form the light incident row pattern 31 that the laser light beams with the larger slow-axis direction light beam widths are incident closer to the center of the light incident surface 19a, whereas the laser light beams with the smaller slow-axis direction light beam widths are incident closer to a periphery of the light incident surface 19a. Accordingly, an overall shape of the light incident row pattern 31 approaches a circular shape smaller in diameter than the light incident surface 19a. Thus, the laser light beams of the semiconductor laser arrays 11a to 11f are allowed to enter, via the collimating members, the circular light incident surface 19a with high efficiency. Further, the laser light beams outputted from the condenser lens 19 are allowed to enter the circular effective reception region of the optical fiber 14 with high efficiency. Hence, a generation of a vignetting phenomenon is suppressed at both the condenser lens 19 and the optical fiber 14, making it possible to increase a fiber coupling efficiency. It is therefore possible for the semiconductor laser device 10 to achieve high optical output.

Also, in the semiconductor laser device 10, the light incident row pattern 31 has the shape symmetrical in the pattern array direction and symmetrical in the direction perpendicular to the pattern array direction with respect to the center of the light incident surface 19a. Accordingly, the overall shape of the light incident row pattern 31 further approaches the circular shape. Thus, the laser light beams outputted from the condenser lens 19 and enter the effective reception region of the optical fiber 14 involve homogeneity. It is therefore possible to achieve high homogeneity in the laser light beams outputted from the light output end surface of the optical fiber 14.

In the semiconductor laser device 10, the heat sink 20 common to the semiconductor laser arrays 11a to 11f may be employed. Hence, a configuration of a cooling mechanism to cool the semiconductor laser arrays 11a to 11f is made simple, making it possible to simplify the configuration of the semiconductor laser device 10.

Second Embodiment

Figure 5:
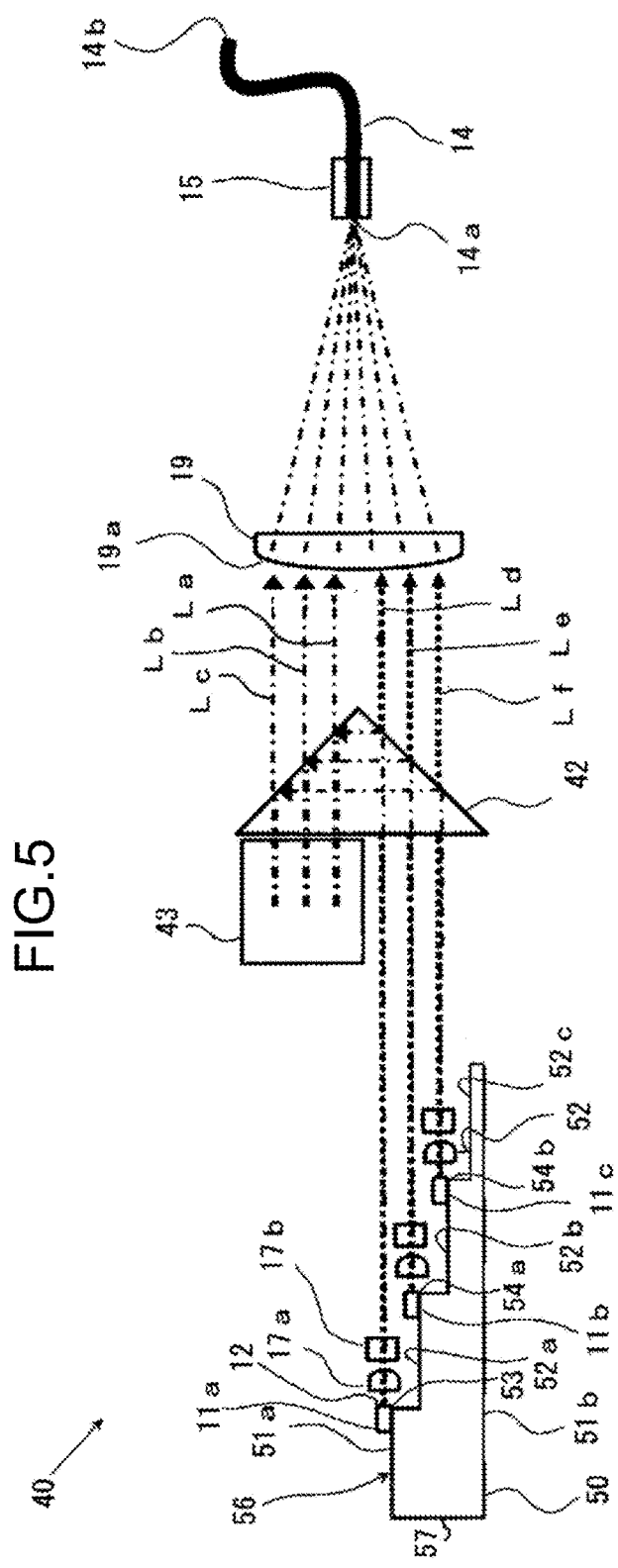
FIG. 5 is a schematic view of another example of a configuration of a semiconductor laser device according to an embodiment of the invention.
Figure 6:
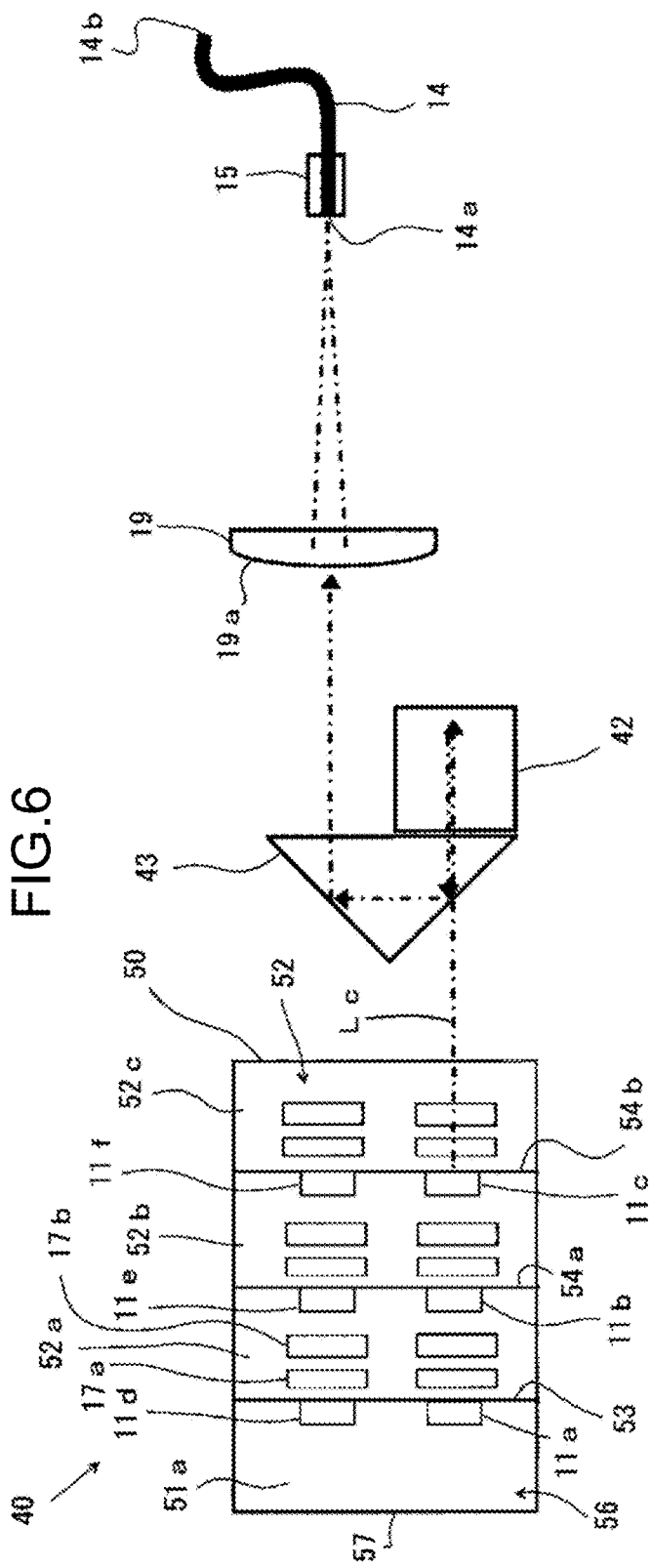
FIG. 6 is a schematic projection view of the semiconductor laser device of FIG. 5 as seen from above.

FIG. 5 is a schematic view of another example of a configuration of a semiconductor laser device according to an embodiment of the invention. FIG. 6 is schematic projection view of the semiconductor laser device of FIG. 5 as seen from above. A semiconductor laser device 40 includes semiconductor laser arrays 11a to 11f and an optical fiber 14. In the semiconductor laser device 40, laser light beams from the semiconductor laser arrays 11a to 11f are outputted to the outside via the optical fiber 14. Further, in the semiconductor laser device 40, the semiconductor laser arrays 11a to 11f may be provided on a heat sink 50. Each of the semiconductor laser arrays 11a to 11f includes a light emission surface (i.e., surface 12). The semiconductor laser arrays 11a to 11f are so disposed on a surface of the heat sink 50 that the light emission surfaces face the same direction (towards the right direction in FIG. 5 and FIG. 6). A sub-mount member (not illustrated in FIG. 5) may be interposed between the heat sink 50 and each of the semiconductor laser arrays 11a to 11f.

The semiconductor laser device 40 may further include collimating members (each include a slow-axis collimator lens array 17a and a fast-axis collimator lens array 17b) provided corresponding to the respective semiconductor laser arrays 11a to 11f. A condenser lens 19 may be provided to oppose the light emission surface (i.e., surface 12) of each of the semiconductor laser arrays 11d to 11f. The condenser lens 19 condenses the laser light beams collimated by the collimating members. A light bending mechanism adapted to bend the laser light beams (i.e., collimated light beams) from the semiconductor laser arrays 11a to 11c may be provided at the downstream side (i.e., the right side of FIG. 5 and FIG. 6) of the light output of the collimating members. The light bending mechanism may include a first folding mirror 42 and a second folding mirror 43. The first folding mirror 42 and the second folding mirror 43 may be, for example but not limited to, a triangular prism.

In the semiconductor laser device 40, the semiconductor laser arrays 11a to 11f, the collimating members (the slow-axis collimator lens array 17a and the fast-axis collimator lens array 17b), the optical fiber 14, and the condenser lens 19 may have the same structure as those in the semiconductor laser device 10 of FIG. 1.

The heat sink 50 may include one step-shaped mounting surface 56. The step-shaped mounting surface 56 includes element mounting surfaces. The element mounting surfaces each may have a size that allows two semiconductor laser arrays to be disposed. Otherwise, the heat sink 50 may have the same structure as the heat sink 20 of the semiconductor laser device 10 of FIG. 1.

FIG. 5 also indicates optical paths La, Lb, Lc, Ld, Le, and Lf. The optical paths La to Lf respectively correspond to paths of the laser light beams from the semiconductor laser arrays 11a to 11f. FIG. 6 only indicates the optical path Lc from the semiconductor laser array 11c.

The heat sink 50 may have a substantially truncated square pyramid shape. A side surface 52 among four side surfaces of the heat sink 50 may be slanted in a step-like shape from a top surface 51a to a bottom surface 51b in a direction of going away from an opposing side surface 57. The other side surfaces among the four side surfaces may be perpendicular to the top surface 51a and the bottom surface 51b. The top surface 51a and the side surface 52 may form the step-shaped mounting surface 56 for disposing the semiconductor laser arrays 11a to 11f.

In the semiconductor laser device 40 of FIG. 5 and FIG. 6, the side surface 52 with the step-like shape may have three steps including a step surface 52a, a step surface 52b, and a step surface 52c. Each of the step surfaces 52a to 52c may have a rectangular shape, and may be disposed parallel to the top surface 51a and the bottom surface 51b.

In the step-shaped mounting surface 56, the top surface 51a, the step surface 52a, and the step surface 52b each may have the size that allows two semiconductor laser arrays to be disposed. Further, from the standpoint of heat dissipation, it is preferable that the top surface 51a, the step surface 52a, and the step surface 52b have their respective sizes that allow entire regions of bottom surfaces (bottom surfaces in FIG. 6) of the two semiconductor laser arrays to come into contact with the top surface 51a, the step surface 52a, and the step surface 52b, and allow the two semiconductor laser arrays to be separated away from each other sufficiently. For example, a separating distance between the two semiconductor arrays may be 2 mm.

In the heat sink 50, the top surface 51a, the step surface 52a, and the step surface 52b may serve as the element mounting surfaces. The element mounting surfaces each may be provided with two semiconductor laser arrays. The semiconductor laser arrays 11a to 11c may be provided at one side (downward side in FIG. 6) of the heat sink 50 in a lamination arrangement in which the semiconductor laser arrays 11a to 11c are disposed in a step-shaped arrangement along a fast-axis direction. Further, the semiconductor laser arrays 11d to 11f may be provided at the other side (upward side in FIG. 6) of the heat sink 50 in a lamination arrangement in which the semiconductor laser arrays 11d to 11f are disposed in a step-shaped arrangement along the fast-axis direction.

In regard to the element mounting surfaces, the light emission surface (i.e., surface 12) of each of the semiconductor laser arrays 11a to 11f may be disposed along an edge 53 between the top surface 51a and the side surface 52, an edge 54a between the step surface 52a and the step surface 52b that is one step lower, or an edge 54b between the step surface 52b and the step surfaces 52c that is one step lower.

In the semiconductor laser device 40 of FIG. 5 and FIG. 6, the light emission surface (i.e., the surface 12) of each of the semiconductor laser arrays 11a to 11f may be disposed at a position on the edge 53 of the top surface 51a, the edge 54a of the step surface 52a, or the edge 54b of the step surface 52b. The collimating members of the respective semiconductor laser arrays 11a to 11f may have the following arrangement. With respect to the top surface 51a having the semiconductor laser array or one of the step surfaces having the semiconductor laser array, the corresponding collimating member is disposed above the step surface that is one step lower.

The light bending mechanism may be located at a position in which the laser light beams of the semiconductor laser arrays 11a to 11c enter the light bending mechanism via the collimating members and the laser light beams outputted from the light bending mechanism enter the condenser lens 19, and in which the laser light beams from the semiconductor laser arrays 11d to 11f do not enter the light bending mechanism. In the light bending mechanism, the first folding mirror 42 and the second folding mirror 43 may be so disposed that the laser light beams from the semiconductor laser arrays 11a to 11c travel the first folding mirror 42 and the second folding mirror 43 in this order to enter the condenser lens 19. More specifically, the laser light beams from the semiconductor laser arrays 11a to 11c first enter the first folding mirror 42. The laser light beams having entered the first folding mirror 42 are bent by the first folding mirror 42 to be outputted from the first folding mirror 42. Then, the laser light beams outputted from the first folding mirror 42 enter the second folding mirror 43. The laser light beams having entered the second folding mirror 43 are bent by the second folding mirror 43 to be outputted from the second folding mirror 43. The laser light beams outputted from the second folding mirror 43 enter the condenser lens 19.

Disposing the semiconductor laser arrays 11a to 11c and the semiconductor laser arrays 11d to 11f in the lamination arrangement with the step-shaped arrangement and bending the optical paths of the laser light beams from the semiconductor laser arrays 11a to 11c with the light bending mechanism, allow for a control of the condenser lens incident optical path lengths of the laser light beams from the semiconductor laser arrays 11a to 11f and a control of the incident positions of the laser light beams from the semiconductor laser arrays 11a to 11f with respect to the light incident surface 19a.

More specifically, by disposing the semiconductor laser arrays 11a to 11c at the respective element mounting surfaces of the step-shaped mounting surface 56 and bending the optical paths of the laser light beams from the semiconductor laser arrays 11a to 11c by the light bending mechanism, the condenser lens incident optical path lengths of the laser light beams of the respective semiconductor laser arrays 11a to 11c involve lengths in order of, from long to short, the laser light beams of the semiconductor laser arrays 11a, the laser light beams of the semiconductor laser arrays 11b, and the laser light beams of the semiconductor laser arrays 11c. Further, by disposing the semiconductor laser arrays 11d to 11f at the respective element mounting surfaces of the step-shaped mounting surface 56, the condenser lens incident optical path lengths of the laser light beams of the respective semiconductor laser arrays 11d to 11f involve lengths in order of, from long to short, the laser light beams of the semiconductor laser arrays 11d, the laser light beams of the semiconductor laser arrays 11e, and the laser light beams of the semiconductor laser arrays 11f. The condenser lens incident optical path lengths of the laser light beams from the semiconductor laser arrays 11a to 11f are thus made relatively different from each other. The laser light beams from the semiconductor laser array 11a correspond to the largest condenser lens incident optical path length.

Also, in regard to the light incident row pattern formed by the laser light beams from the semiconductor laser arrays 11a to 11c at the light incident surface 19a, the laser light beams from the semiconductor laser arrays 11a to 11c enter the light incident surface 19a in order, from a center side, the laser light beams of the semiconductor 11a, the laser light beams of the semiconductor 11b, and the laser light beams of the semiconductor 11c. More specifically, the laser light beams from the semiconductor laser array 11a that corresponds to the largest condenser lens incident optical path length among the semiconductor laser arrays 11a to 11c enter the light incident surface 19a at a position (i.e., near-center position) closest to the center, whereas the laser light beams from the semiconductor laser array 11c that corresponds to the smallest condenser lens incident optical path length among the semiconductor laser arrays 11a to 11c enter the light incident surface 19a at a position (i.e., peripheral position) that is the most distant from the center. Further, in regard to the light incident row pattern formed by the laser light beams from the semiconductor laser arrays 11d to f at the light incident surface 19a, the laser light beams from the semiconductor laser arrays 11d to 11f enter the light incident surface 19a in order, from a center side, the laser light beams of the semiconductor 11d, the laser light beams of the semiconductor 11e, and the laser light beams of the semiconductor 11f. More specifically, the laser light beams from the semiconductor laser array 11d that corresponds to the largest condenser lens incident optical path length among the semiconductor laser arrays 11d to 11f enter the light incident surface 19a at a position (i.e., near-center position) closest to the center, whereas the laser light beams from the semiconductor laser array 11f that corresponds to the smallest condenser lens incident optical path length among the semiconductor laser arrays 11d to 11f enter the light incident surface 19a at a position (i.e., peripheral position) that is the most distant from the center. The laser light beams from the semiconductor laser array 11a that corresponds to the largest condenser lens incident optical path length enter the condenser lens 19 at a center side position of the light incident row pattern as compared with the positions of the laser light beams from the semiconductor laser arrays 11b, 11c, 11e, and 11f.

In the semiconductor laser device 40 of FIG. 5 and FIG. 6, the incident positions at the light incident surface 19a of the laser light beams from the semiconductor laser arrays that are disposed at the same element mounting surface may be symmetrical with respect to the center of the light incident surface 19a. The center of the light incident row pattern 31 formed at the light incident surface 19a may be located at the center of the light incident surface 19a, and the light incident row pattern 31 may have a shape symmetrical in a direction perpendicular to the pattern array direction with respect to the center of the light incident row pattern, i.e., the center of the light incident surface 19a.

Therefore, in the semiconductor laser device 40, the laser light beams from the semiconductor laser arrays 11a to 11f are collimated by the collimating members (the slow-axis collimator lens array 17a and the fast-axis collimator lens array 17b). The laser light beams from the semiconductor laser arrays 11d to 11f collimated by the collimating members are directed to the condenser lens 19. The laser light beams from the semiconductor laser arrays 11a to 11c collimated by the collimating members are so bent by the light bending mechanism as to be directed to the condenser lens 19. The laser light beams from the semiconductor laser arrays 11a to 11f (the collimated light beams) are condensed by the condenser lens 19 to enter a light incident end surface (i.e., one end surface 14a) of the optical fiber 14. In this manner, the laser light beams from the semiconductor laser arrays 11a to 11f, having entered an effective reception region in the light incident end surface of the optical fiber 14, are guided by the optical fiber 14 to be outputted from a light output end surface (i.e., other end surface 14b) of the optical fiber 14 to the outside. The output light may be utilized as source light for a projector device without limitation.

In the semiconductor laser device 40, the semiconductor laser arrays 11a to 11c and the semiconductor laser arrays 11d to 11f are provided at the surfaces (i.e., step-shaped mounting surface 56) of the heat sink 50 in the lamination arrangement in which the semiconductor laser arrays 11a to 11c and the semiconductor laser arrays 11d to 11f are disposed in the step-shaped arrangement along the fast-axis direction. Accordingly, adjacent semiconductor laser arrays are largely distanced from each other, making it possible to achieve high heat dissipation. As a result, each of the semiconductor laser arrays 11a to 11f involves high reliability and high output.

Also, the laser light beams from the semiconductor laser arrays 11a to 11c so enter the circular light incident surface 19a of the condenser lens 19 that the larger the condenser lens incident optical path length of the laser light beams, the closer the incidence position is with respect to the center of the light incident surface 19a. The laser light beams from the semiconductor laser arrays 11d to 11f so enter the circular light incident surface 19a of the condenser lens 19 that the larger the condenser lens incident optical path length of the laser light beams, the closer the incidence position is with respect to the center of the light incident surface 19a. More specifically, the laser light beams from the semiconductor laser arrays 11a to 11c and the laser light beams from the semiconductor laser arrays 11d to 11f are both so projected in the side-by-side arrangement manner onto the light incident surface 19a of the condenser lens 19 to form the light incident row pattern 31 that the laser light beams with the larger slow-axis direction light beam widths are incident closer to the center of the light incident surface 19a, whereas the laser light beams with the smaller slow-axis direction light beam widths are incident closer to a periphery of the light incident surface 19a. Accordingly, an overall shape of the light incident row pattern approaches a circular shape smaller in diameter than the light incident surface 19a. Thus, the laser light beams of the semiconductor laser arrays 11a to 11f are allowed to enter, via the collimating members, the circular light incident surface 19a with high efficiency. Further, the laser light beams outputted from the condenser lens 19 are allowed to enter the circular effective reception region of the optical fiber 14 with high efficiency. Hence, a generation of a vignetting phenomenon is suppressed at both the condenser lens 19 and the optical fiber 14, making it possible to increase a fiber coupling efficiency. It is therefore possible for the semiconductor laser device 40 to achieve high optical output.

Also, in the semiconductor laser device 40, the light incident row pattern 31 formed at the light incident surface 19a has the shape substantially symmetrical in the pattern array direction and symmetrical in the direction perpendicular to the pattern array direction with respect to the center of the light incident row pattern. Accordingly, the overall shape of the light incident row pattern further approaches the circular shape. Thus, the laser light beams outputted from the condenser lens 19 and enter the effective reception region of the optical fiber 14 involve homogeneity. It is therefore possible to achieve high homogeneity in the laser light beams outputted from the light output end surface of the optical fiber 14.

In the semiconductor laser device 40, the heat sink 50 common to the semiconductor laser arrays 11a to 11f may be employed. Hence, a configuration of a cooling mechanism to cool the semiconductor laser arrays 11a to 11f is made simple, making it possible to simplify the configuration of the semiconductor laser device 40.

Third Embodiment

Figure 7:
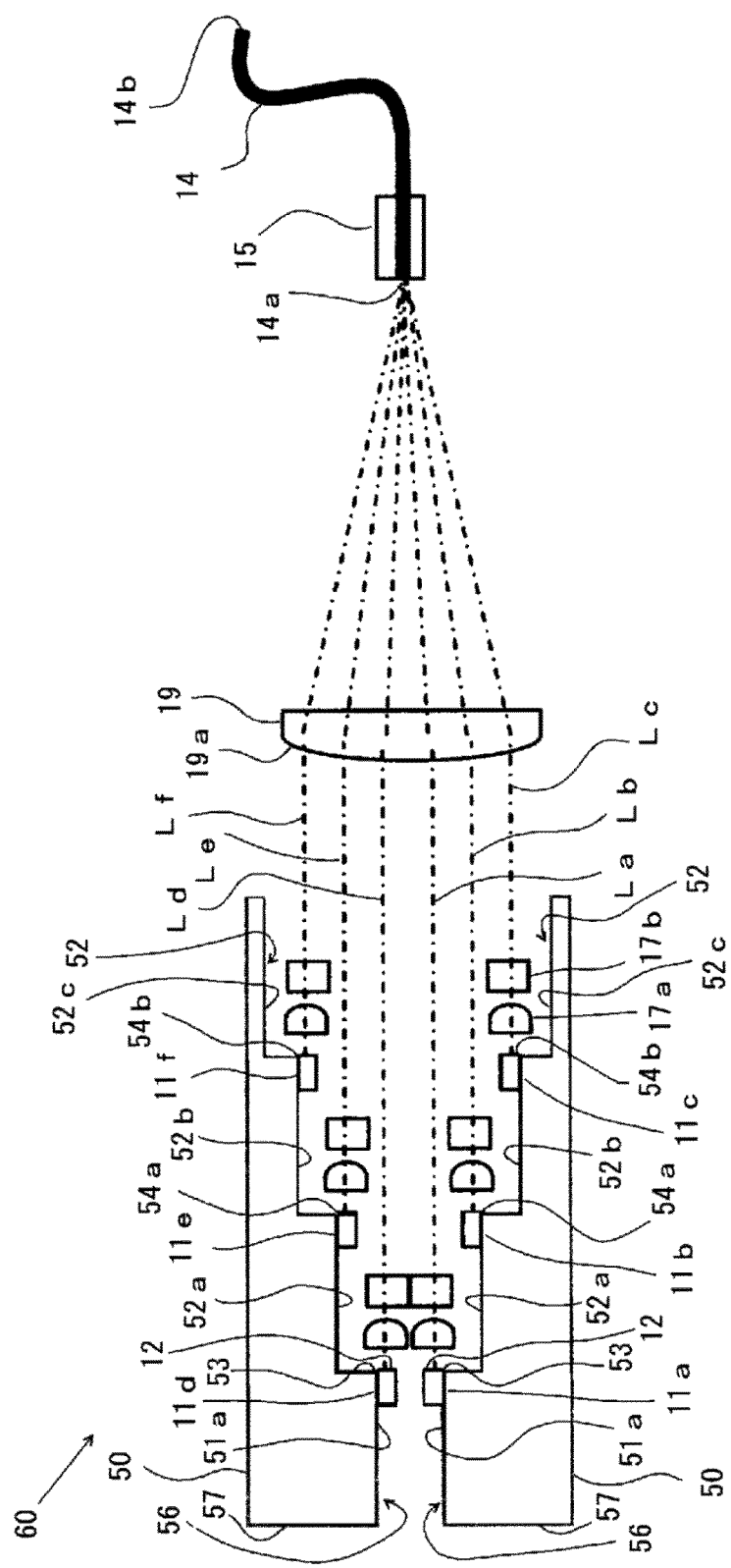
FIG. 7 is a schematic view of a further example of a configuration of a semiconductor laser device according to an embodiment of the invention.

FIG. 7 is a schematic view of a further example of a configuration of a semiconductor laser device according to an embodiment of the invention. A semiconductor laser device 60 includes semiconductor laser arrays 11a to 11f and an optical fiber 14. In the semiconductor laser device 60, laser light beams from the semiconductor laser arrays 11a to 11f are outputted to the outside via the optical fiber 14. In the semiconductor laser device 60, each of the semiconductor laser arrays 11a to 11f includes a light emission surface (i.e., surface 12). The semiconductor laser arrays 11a to 11f are so disposed that the light emission surfaces face the same direction (towards the right direction in FIG. 7). Further, the semiconductor laser device 60 may include two heat sinks 50. The semiconductor laser arrays 11a to 11f may be provided on surfaces of the respective heat sinks 50. A sub-mount member may be interposed between one of the two heat sinks 50 and each of the semiconductor laser arrays 11a to 11c. The sub-mount member may also be interposed between the other of the two heat sinks 50 and each of the semiconductor laser arrays 11d to 11f. The heat sinks 50 may include respective step-shaped mounting surfaces 56. The step-shaped mounting surfaces 56 may include respective element mounting surfaces. The heat sinks 50 are so disposed that the element mounting surfaces of one of the step-shaped mounting surface 56 and the element mounting surfaces of the other step-shaped mounting surface 56 are opposed to each other.

The semiconductor laser device 60 may further include collimating members (each include a slow-axis collimator lens array 17a and a fast-axis collimator lens array 17b) provided corresponding to the respective semiconductor laser arrays 11a to 11f. A condenser lens 19 may be provided to oppose the light emission surface (i.e., surface 12) of each of the semiconductor laser arrays 11a to 11f. The condenser lens 19 condenses the laser light beams collimated by the collimating members. In the semiconductor laser device 60, the semiconductor laser arrays 11a to 11f, the collimating members (the slow-axis collimator lens array 17a and the fast-axis collimator lens array 17b), the optical fiber 14, and the condenser lens 19 may have the same structure as those in the semiconductor laser device 10 of FIG. 1.

In each of the two heat sinks 50, the element mounting surfaces of the step-shaped mounting surfaces 56 each may have a size that allows one semiconductor laser array to be disposed. Otherwise, the heat sinks 50 each may have the same configuration as the heat sink 50 of the semiconductor laser device 40 of FIG. 5 and FIG. 6. In the semiconductor laser device 60, the two heat sinks 50 may have the same configuration as each other. The step-shaped mounting surfaces 56 are disposed to oppose each other. The element mounting surfaces of one of the step-shaped mounting surfaces 56 and the element mounting surfaces of the other step-shaped mounting surface 56 are disposed to oppose each other. Accordingly, the heat sinks 50 symmetrically mirror each other with respect to an optical axis of the condenser lens 19.

In the two heat sinks 50, the element mounting surfaces of the respective step-shaped mounting surfaces 56 are each provided with one semiconductor laser array. In one of the heat sinks 50 (provided at lower side of FIG. 7), the semiconductor laser arrays 11a to 11c are provided in a lamination arrangement in which the semiconductor laser arrays 11a to 11c are disposed in a step-shaped arrangement along a fast-axis direction. In the other heat sink 50 (provided at upper side of FIG. 7), the semiconductor laser arrays 11d to 11f are provided in a lamination arrangement in which the semiconductor laser arrays 11d to 11f are disposed in a step-shaped arrangement along a fast-axis direction. The semiconductor laser arrays 11a to 11f are so disposed in a lamination arrangement in a V-shape along the fast-axis direction as to be mirror symmetry with respect to the optical axis of the condenser lens 19.

In regard to the element mounting surfaces, the light emission surface (i.e., surface 12) of each of the semiconductor laser arrays 11a to 11f is disposed along edges 53 between top surfaces 51a and side surfaces 52, edges 54a between step surfaces 52a and step surfaces 52b that are one step lower, or edges 54b between step surfaces 52b and step surfaces 52c that are one step lower. In the semiconductor laser device 60 of FIG. 7, the light emission surface (i.e., the surface 12) of each of the semiconductor laser arrays 11a to 11f is disposed at a position on the edges 53 of the top surfaces 51a, the edges 54a of the step surfaces 52a, or the edges 54b of the step surfaces 52b. The collimating members of the semiconductor laser arrays 11a to 11f may have the following arrangement. With respect to one of the top surfaces 51a having the semiconductor laser array or one of the step surfaces having the semiconductor laser array, the corresponding collimating member is disposed above the step surface that is one step lower.

As in the element mounting surfaces in the semiconductor laser device 10 of FIG. 1, it is preferable that, in the two heat sinks 50, the top surfaces 51a, the step surfaces 52a, and the step surfaces 52b have their respective sizes that allow entire regions of bottom surfaces (bottom surfaces in FIG. 7) of the semiconductor laser arrays 11a to 11f to come into contact with the top surfaces 51a, the step surfaces 52a, and the step surfaces 52b, from the standpoint of heat dissipation.

By so disposing the semiconductor laser arrays 11a to 11f in the lamination arrangement in the V-shape along the fast-axis direction as to form mirror symmetry with respect to the optical axis of the condenser lens 19, the condenser lens incident optical path lengths of the laser light beams from the semiconductor laser arrays 11a to 11f and the incident positions of the laser light beams from the semiconductor laser arrays 11a to 11f with respect to the light incident surface 19a are controlled. More specifically, by disposing the semiconductor laser arrays 11a to 11c at the respective element mounting surfaces of the step-shaped mounting surface 56 of one of the heat sinks 50, the condenser lens incident optical path lengths of the laser light beams of the respective semiconductor laser arrays 11a to 11c involve lengths in order of, from long to short, the laser light beams of the semiconductor laser arrays 11a, the laser light beams of the semiconductor laser arrays 11b, and the laser light beams of the semiconductor laser arrays 11c. Further, by disposing the semiconductor laser arrays 11d to 11f at the respective element mounting surfaces of the step-shaped mounting surface 56 of the other heat sink 50, the condenser lens incident optical path lengths of the laser light beams of the respective semiconductor laser arrays 11d to 11f involve lengths in order of, from long to short, the laser light beams of the semiconductor laser arrays 11d, the laser light beams of the semiconductor laser arrays 11e, and the laser light beams of the semiconductor laser arrays 11f. The condenser lens incident optical path lengths of the laser light beams from the semiconductor laser arrays 11a to 11c are thus made relatively different from each other. Further, the condenser lens incident optical path lengths of the laser light beams from the semiconductor laser arrays 11d to 11f are thus made relatively different from each other.

Also, the laser light beams from the semiconductor laser arrays 11a to 11c enter the light incident surface 19a in order, from a center side, the laser light beams of the semiconductor 11a, the laser light beams of the semiconductor 11b, and the laser light beams of the semiconductor 11c in respect to the light incident surface 19a. More specifically, the laser light beams from the semiconductor laser array 11a that corresponds to the largest condenser lens incident optical path length among the semiconductor laser arrays 11a to 11c enter the light incident surface 19a at a position (i.e., near-center position) closest to the center, whereas the laser light beams from the semiconductor laser array 11c that corresponds to the smallest condenser lens incident optical path length among the semiconductor laser arrays 11a to 11c enter the light incident surface 19a at a position (i.e., peripheral position) that is the most distant from the center. The laser light beams from the semiconductor laser arrays 11d to 11f enter the light incident surface 19a in order, from a center side, the laser light beams of the semiconductor 11d, the laser light beams of the semiconductor 11e, and the laser light beams of the semiconductor 11f in respect to the light incident surface 19a. More specifically, the laser light beams from the semiconductor laser array 11d that corresponds to the largest condenser lens incident optical path length among the semiconductor laser arrays 11d to 11f enter the light incident surface 19a at a position (i.e., near-center position) closest to the center, whereas the laser light beams from the semiconductor laser array 11f that corresponds to the smallest condenser lens incident optical path length among the semiconductor laser arrays 11d to 11f enter the light incident surface 19a at a position (i.e., peripheral position) that is the most distant from the center.

In the semiconductor laser device 60 of FIG. 7, the condenser lens incident optical path lengths of the semiconductor laser arrays that are disposed to oppose each other are the same as each other. More specifically, the condenser lens incident optical path length of the semiconductor laser array 11a and the condenser lens incident optical path length of the semiconductor laser array 11d are the same. The condenser lens incident optical path length of the semiconductor laser array 11b and the condenser lens incident optical path length of the semiconductor laser array 11e are the same. The condenser lens incident optical path length of the semiconductor laser array 11c and the condenser lens incident optical path length of the semiconductor laser array 11f are the same.

In the semiconductor laser device 60 of FIG. 7, the incident positions at the light incident surface 19a of the laser light beams from the semiconductor laser arrays that are disposed to oppose each other are symmetrical with respect to the center of the light incident surface 19a. The center of the light incident row pattern 31 formed at the light incident surface 19a may be located at the center of the light incident surface 19a, and the light incident row pattern 31 may have a shape symmetrical in the pattern array direction and symmetrical in the direction perpendicular to the pattern array direction with respect to the center of the light incident row pattern 31, i.e., the center of the light incident surface 19a.

Therefore, in the semiconductor laser device 60, the laser light beams from the semiconductor laser arrays 11a to 11f are collimated by the collimating members (the slow-axis collimator lens array 17a and the fast-axis collimator lens array 17b). The laser light beams collimated by the collimating members are condensed by the condenser lens 19 to enter a light incident end surface (i.e., one end surface 14a) of the optical fiber 14. In this manner, the laser light beams from the semiconductor laser arrays 11a to 11f, having entered an effective reception region in the light incident end surface of the optical fiber 14, are guided by the optical fiber 14 to be outputted from a light output end surface (i.e., other end surface 14b) of the optical fiber 14 to the outside. The output light may be utilized as source light for a projector device without limitation.

In the semiconductor laser device 60, the semiconductor laser arrays 11a to 11f are provided at the surfaces (i.e., the step-shaped mounting surfaces 56) of the two heat sinks 50 in the lamination arrangement in the V-shape along the fast-axis direction. Accordingly, adjacent semiconductor laser arrays are largely distanced from each other, making it possible to achieve high heat dissipation. As a result, each of the semiconductor laser arrays 11a to 11f involves high reliability and high output.

Also, the laser light beams from the semiconductor laser arrays 11a to 11f so enter the circular light incident surface 19a of the condenser lens 19, to form the light incident row pattern, that the larger the condenser lens incident optical path length of the laser light beams, the closer the incidence position is with respect to the center of the light incident surface 19a. More specifically, the laser light beams are so projected in the side-by-side arrangement manner onto the light incident surface 19a of the condenser lens 19 to form the light incident row pattern 31 that the laser light beams with the larger slow-axis direction light beam widths are incident closer to the center of the light incident surface 19a, whereas the laser light beams with the smaller slow-axis direction light beam widths are incident closer to a periphery of the light incident surface 19a. Accordingly, an overall shape of the light incident row pattern approaches a circular shape smaller in diameter than the light incident surface 19a. Thus, the laser light beams of the semiconductor laser arrays 11a to 11f are allowed to enter, via the collimating members, the circular light incident surface 19a with high efficiency. Further, the laser light beams outputted from the condenser lens 19 are allowed to enter the circular effective reception region of the optical fiber 14 with high efficiency. Hence, a generation of a vignetting phenomenon is suppressed at both the condenser lens 19 and the optical fiber 14, making it possible to increase a fiber coupling efficiency. It is therefore possible for the semiconductor laser device 60 to achieve high optical output.

Also, in the semiconductor laser device 60, the light incident row pattern 31 formed at the light incident surface 19a has the shape symmetrical in the pattern array direction and symmetrical in the direction perpendicular to the pattern array direction with respect to the center of the light incident row pattern 31. Accordingly, the overall shape of the light incident row pattern further approaches the circular shape. Thus, the laser light beams outputted from the condenser lens 19 and enter the effective reception region of the optical fiber 14 involve homogeneity. It is therefore possible to achieve high homogeneity in the laser light beams outputted from the light output end surface of the optical fiber 14.

The semiconductor laser device of the invention is not limited to the above-described example embodiments. It is sufficient that at one or more semiconductor laser arrays among the semiconductor laser arrays corresponds to the condenser lens incident optical path length that is relatively different from others, and the laser light beams having the largest condenser lens incident optical path length derived from the semiconductor laser array enter the light incident surface of the condenser lens at any position other than the outermost position of the light incident row pattern formed on the light incident surface.

For example, in regard to the first embodiment and the third embodiment, the laser light beams of the semiconductor laser array that corresponds to the largest condenser lens incident optical path length may enter the condenser lens at any position other than the outermost position of the light incident row pattern at the condenser lens. Hence, the laser light beams of any other semiconductor laser array may enter the condenser lens at any other position of the light incident row pattern.

Further, in regard to the second embodiment, the laser light beams of the semiconductor laser array that corresponds to the largest condenser lens incident optical path length may enter the condenser lens at the center side position of the light incident row pattern in comparison with the position of the laser light beams from one or more of the other semiconductor laser arrays. Hence, there may be laser light beams that enter the condenser lens at a center side position of the light incident row pattern in comparison with the position of the laser light beams of the semiconductor laser array that corresponds to the largest condenser lens incident optical path length.

The semiconductor laser device may have a configuration in which the light incident row pattern formed at the light incident surface of the condenser lens or the lengths of the condenser lens incident optical path lengths of the laser light beams derived from the semiconductor laser arrays are controlled by any of various existing optical members, without being limited to the configurations described in the first embodiment to the third embodiment.

The following is a description of an experiment example confirming effects of the invention. It should be understood that the experiment example is illustrative, and should not be construed as being limiting in any way.

EXPERIMENT EXAMPLE 1

Based upon the configuration of FIG. 1, a semiconductor laser device (hereinafter may be also referred to as "semiconductor laser device 1") as follows was made. The semiconductor laser device included a heat sink having two step-shaped mounting surfaces, with element mounting surfaces, disposed to oppose each other at a surface of the heat sink, and a semiconductor laser array provided on each of the element mounting surfaces. Eight semiconductor laser arrays were employed whose specifications were the same as each other.

In the semiconductor laser device 1, four semiconductor laser arrays were disposed at each of the two step-shaped mounting surfaces. The four semiconductor laser arrays were disposed at equal distances. More specifically, a distance between each of four the semiconductor laser arrays in a direction along an optical axis was 15 mm, and a distance between each of the four semiconductor laser arrays in a direction perpendicular to the optical axis direction was 1 mm. The smallest condenser lens incident optical path length was 150 mm. A length (length in a direction of arrangement of light-emitting elements) of each of the eight semiconductor laser arrays was 4 mm. A condenser lens having a focal length of 20 mm was employed. An optical fiber had a core diameter of 0.8 mm and a numerical aperture (NA) of 0.22.

In the semiconductor laser device 1, a wavelength of laser light outputted from a collimating member was 640 nm. A light beam size was as follows. A length (a light beam width in a fast-axis direction) in the fast-axis direction was 0.8 mm. A length (a light beam width in a slow-axis direction) in the slow-axis direction was 4 mm A divergence angle half value width in the fast-axis direction was 2 mrad. A divergence angle half value width in the slow-axis direction was 50 mrad. An examination on a fiber coupling efficiency of the semiconductor laser device 1 revealed that the fiber coupling efficiency was 98%.

Next, based on FIG. 9, another semiconductor laser device (hereinafter may be also referred to as "comparative semiconductor laser device 1") as follows was made. The comparative semiconductor laser device 1 included a heat sink having a single step-shaped mounting surface, with element mounting surfaces, disposed at a surface of the heat sink, and a semiconductor laser array provided on each of the element mounting surfaces. Eight semiconductor laser arrays were employed whose specifications were the same as each other.

The comparative semiconductor laser device 1 had the same configuration as the semiconductor laser device 1, with the exception that the eight semiconductor laser arrays were disposed in a lamination arrangement on the element mounting surfaces of the single step-shaped mounting surface in the comparative semiconductor laser device 1. An examination on a fiber coupling efficiency of the comparative semiconductor laser device 1 revealed that the fiber coupling efficiency was 92%.

The invention encompasses any possible combination of some or all of the various embodiments described herein and incorporated herein. It is possible to achieve at least the following configurations from the above-described example embodiments of the invention.

(1) A semiconductor laser device, including:
a plurality of semiconductor laser arrays each including a plurality of linearly-disposed light emitting elements;
collimating members each disposed in an optical path of a light beam array emitted from each of the semiconductor laser arrays;
a condenser lens provided, in common, for a plurality of collimated light beam arrays outputted from the respective collimating members, and including a light incident surface on which a light incident row pattern is formed through entering of the collimated light beam arrays, the light incident row pattern including a plurality of light incident regions arranged in a side-by-side arrangement manner; and
an optical fiber including a substantially-circular-shaped light incident end surface where light from the condenser lens enters, wherein a condenser lens incident optical path length of at least one of the semiconductor laser arrays is different from a condenser lens incident optical path length of any other one of the semiconductor laser arrays, the condenser lens incident optical path length being defined as a length of an optical path from each of the semiconductor laser arrays to the condenser lens, and a collimated light beam array derived from one of the semiconductor laser arrays that corresponds to the largest condenser lens incident optical path length is directed to a predetermined light incident region in the light incident surface of the condenser lens, the predetermined light incident region being other than the outermost light incident region in the light incident row pattern.

(2) The semiconductor laser device according to (1), wherein the condenser lens incident optical path lengths of the respective semiconductor laser arrays may be different from each other, and a collimated light beam array derived from one of the semiconductor laser arrays that corresponds to a larger condenser lens incident optical path length may be directed to a more center-sided light incident region in the light incident row pattern, as compared with a collimated light beam array derived from one of the semiconductor laser arrays that corresponds to a smaller condenser lens incident optical path length.

(3) The semiconductor laser device according to (1), wherein the semiconductor laser arrays may include three or more semiconductor laser arrays, the condenser lens incident optical path lengths of the respective three or more semiconductor laser arrays may be different from each other, and a collimated light beam array derived from one of the three or more semiconductor laser arrays that corresponds to the largest condenser lens incident optical path length may be directed to a more center-sided light incident region in the light incident row pattern, as compared with a collimated light beam array derived from any other one or more of the three or more semiconductor laser arrays.

(4) The semiconductor laser device according to any one of (1) to (3), the device may further include a step-shaped mounting surface including a plurality of element mounting surfaces that form a shape of steps, wherein providing of the semiconductor laser arrays on the respective element mounting surfaces may cause the condenser lens incident optical path lengths of the respective semiconductor laser arrays to be different from each other.

(5) The semiconductor laser device according to (4), wherein the step-shaped mounting surface may include a surface of a heat sink.

(6) The semiconductor laser device according to (4) or (5), the device may further include a folding mirror, wherein the step-shaped mounting surface may include two step-shaped mounting surfaces each including the plurality of element mounting surfaces and disposed to oppose each other, the semiconductor laser arrays may be provided on the respective element mounting surfaces, the folding mirror may be provided between the step-shaped mounting surfaces, and the collimated light beam arrays that are derived from the respective semiconductor laser arrays and reflected from the folding mirror may enter the light incident surface of the condenser lens.

Although the invention has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:

1. A semiconductor laser device, comprising:
a plurality of semiconductor laser arrays each including a plurality of linearly-disposed light emitting elements;
collimating members each disposed in an optical path of a light beam array emitted from each of the semiconductor laser arrays;
a condenser lens provided, in common, for a plurality of collimated light beam arrays outputted from the respective collimating members, and including a light incident surface on which a light incident row pattern is formed through entering of the collimated light beam arrays, the light incident row pattern including a plurality of light incident regions arranged in a side-by-side arrangement manner; and
an optical fiber including a substantially-circular-shaped light incident end surface where light from the condenser lens enters, wherein
a condenser lens incident optical path length of at least one of the semiconductor laser arrays is different from a condenser lens incident optical path length of any other one of the semiconductor laser arrays, the condenser lens incident optical path length being defined as a length of an optical path from each of the semiconductor laser arrays to the condenser lens,
a collimated light beam array derived from one of the semiconductor laser arrays that corresponds to the largest condenser lens incident optical path length is directed to a predetermined light incident region in the light incident surface of the condenser lens, the predetermined light incident region being other than the outermost light incident region in the light incident row pattern,
the condenser lens incident optical path lengths of the respective semiconductor laser arrays are different from each other, and
a collimated light beam array derived from one of the semiconductor laser arrays that corresponds to a larger condenser lens incident optical path length is directed to a more center-sided light incident region in the light incident row pattern, as compared with a collimated light beam array derived from one of the semiconductor laser arrays that corresponds to a smaller condenser lens incident optical path length.

2. The semiconductor laser device according to claim 1, further comprising a step-shaped mounting surface including a plurality of element mounting surfaces that form a shape of steps, wherein
providing of the semiconductor laser arrays on the respective element mounting surfaces causes the condenser lens incident optical path lengths of the respective semiconductor laser arrays to be different from each other.

3. The semiconductor laser device according to claim 2, wherein the step-shaped mounting surface comprises a surface of a heat sink.

4. The semiconductor laser device according to claim 2, further comprising a folding mirror, wherein
the step-shaped mounting surface comprises two step-shaped mounting surfaces each including the plurality of element mounting surfaces and disposed to oppose each other, the semiconductor laser arrays being provided on the respective element mounting surfaces,
the folding mirror is provided between the step-shaped mounting surfaces, and
the collimated light beam arrays that are derived from the respective semiconductor laser arrays and reflected from the folding mirror enter the light incident surface of the condenser lens.

5. The semiconductor laser device according to claim 1, wherein
the semiconductor laser arrays comprise three or more semiconductor laser arrays,
the condenser lens incident optical path lengths of the respective three or more semiconductor laser arrays are different from each other, and
a collimated light beam array derived from one of the three or more semiconductor laser arrays that corresponds to the largest condenser lens incident optical path length is directed to a more center-sided light incident region in the light incident row pattern, as compared with a collimated light beam array derived from any other one or more of the three or more semiconductor laser arrays.

6. A semiconductor laser device, comprising:
a plurality of semiconductor laser arrays each including a plurality of linearly-disposed light emitting elements;
collimating members each disposed in an optical path of a light beam array emitted from each of the semiconductor laser arrays;
a condenser lens provided, in common, for a plurality of collimated light beam arrays outputted from the respective collimating members, and including a light incident surface on which a light incident row pattern is formed through entering of the collimated light beam arrays, the light incident row pattern including a plurality of light incident regions arranged in a side-by-side arrangement manner; and
an optical fiber including a substantially-circular-shaped light incident end surface where light from the condenser lens enters, wherein
a condenser lens incident optical path length of at least one of the semiconductor laser arrays is different from a condenser lens incident optical path length of any other one of the semiconductor laser arrays, the condenser lens incident optical path length being defined as a length of an optical path from each of the semiconductor laser arrays to the condenser lens,
a collimated light beam array derived from one of the semiconductor laser arrays that corresponds to the largest condenser lens incident optical path length is directed to a predetermined light incident region in the light incident surface of the condenser lens, the predetermined light incident region being other than the outermost light incident region in the light incident row pattern,
the semiconductor laser arrays comprise three or more semiconductor laser arrays,
the condenser lens incident optical path lengths of the respective three or more semiconductor laser arrays are different from each other, and
a collimated light beam array derived from one of the three or more semiconductor laser arrays that corresponds to the largest condenser lens incident optical path length is directed to a more center-sided light incident region in the light incident row pattern, as compared with a collimated light beam array derived from any other one or more of the three or more semiconductor laser arrays.

7. A semiconductor laser device, comprising:
a plurality of semiconductor laser arrays each including a plurality of linearly-disposed light emitting elements;
collimating members each disposed in an optical path of a light beam array emitted from each of the semiconductor laser arrays;
a condenser lens provided, in common, for a plurality of collimated light beam arrays outputted from the respective collimating members, and including a light incident surface on which a light incident row pattern is formed through entering of the collimated light beam arrays, the light incident row pattern including a plurality of light incident regions arranged in a side-by-side arrangement manner;
an optical fiber including a substantially-circular-shaped light incident end surface where light from the condenser lens enters;
a folding mirror; and
a step-shaped mounting surface including a plurality of element mounting surfaces that form a shape of steps, wherein
a condenser lens incident optical path length of at least one of the semiconductor laser arrays is different from a condenser lens incident optical path length of any other one of the semiconductor laser arrays, the condenser lens incident optical path length being defined as a length of an optical path from each of the semiconductor laser arrays to the condenser lens,
a collimated light beam array derived from one of the semiconductor laser arrays that corresponds to the largest condenser lens incident optical path length is directed to a predetermined light incident region in the light incident surface of the condenser lens, the predetermined light incident region being other than the outermost light incident region in the light incident row pattern,
providing of the semiconductor laser arrays on the respective element mounting surfaces causes the condenser lens incident optical path lengths of the respective semiconductor laser arrays to be different from each other,
the step-shaped mounting surface comprises two step-shaped mounting surfaces each including the plurality of element mounting surfaces and disposed to oppose each other, the semiconductor laser arrays being provided on the respective element mounting surfaces,
the folding mirror is provided between the step-shaped mounting surfaces, and
the collimated light beam arrays that are derived from the respective semiconductor laser arrays and reflected from the folding mirror enter the light incident surface of the condenser lens.

* * * * *